United States Patent
Ide

(10) Patent No.: US 9,048,857 B2
(45) Date of Patent: Jun. 2, 2015

(54) ANALOG-TO-DIGITAL CONVERTER CIRCUIT AND METHOD OF CONTROLLING ANALOG-TO-DIGITAL CONVERTER CIRCUIT

(71) Applicant: FUJITSU SEMICONDUCTOR LIMITED, Yokohama-shi, Kanagawa (JP)

(72) Inventor: Tatsuya Ide, Kasugai (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/527,327

(22) Filed: Oct. 29, 2014

(65) Prior Publication Data

US 2015/0116140 A1    Apr. 30, 2015

(30) Foreign Application Priority Data

Oct. 30, 2013    (JP) .................. 2013-225494

(51) Int. Cl.
| | |
|---|---|
| H03M 1/00 | (2006.01) |
| H03M 1/06 | (2006.01) |
| H03M 1/12 | (2006.01) |
| H03M 1/44 | (2006.01) |

(52) U.S. Cl.
CPC ............ *H03M 1/0607* (2013.01); *H03M 1/124* (2013.01); *H03M 1/442* (2013.01)

(58) Field of Classification Search
CPC ........ H03M 1/00; H03M 1/12; H03M 1/0695
USPC .......... 341/122, 120, 118, 155, 156, 161, 162
See application file for complete search history.

(56) References Cited

U.S. PATENT DOCUMENTS

| | | |
|---|---|---|
| 5,274,377 A | 12/1993 | Matsuura et al. |
| 5,696,511 A | 12/1997 | Matsumoto et al. |
| 2010/0073214 A1* | 3/2010 | Kawahito et al. ............. 341/155 |

FOREIGN PATENT DOCUMENTS

| | | |
|---|---|---|
| JP | 9-275342 A | 10/1997 |
| JP | 3153271 B2 | 1/2001 |
| JP | 4483473 B2 | 4/2010 |

* cited by examiner

*Primary Examiner* — Joseph Lauture
(74) *Attorney, Agent, or Firm* — Arent Fox LLP

(57) ABSTRACT

An analog-to-digital converter circuit includes a plurality of conversion stages that are cascaded to be coupled in series. Each of the plurality of conversion stages includes a signal holding circuit configured to hold an input voltage, an analog-to-digital converter configured to convert the input voltage into a digital signal based on a first reference voltage, a digital-to-analog converter configured to generate a first voltage according to the digital signal, the first reference voltage, and the input voltage, an amplifier configured to amplify the first voltage to generate an output voltage, and a reference holding circuit configured to hold a holding voltage that is in proportion to the first reference voltage. The amplifier is coupled to the reference holding circuit to receive and amplify the holding voltage to generate a second reference voltage.

13 Claims, 25 Drawing Sheets

Fig.16(a)

| | | | | | | | |
|---|---|---|---|---|---|---|---|
| 101 | Sample, signal | Comparison Hold, reference | Sample, reference | Hold, signal | Sample, reference | Hold, signal | Sample, signal | Comparison Hold, reference |
| 102 | Comparison Hold, reference | Sample, reference | Hold, signal | Sample, signal | Comparison Hold, reference | Sample, signal | Comparison Hold, reference | Sample, reference |
| 103 | Sample, reference | Hold, signal | Sample, signal | Comparison Hold, reference | Sample, signal | Comparison Hold, reference | Sample, reference | Hold, signal |

Fig.16(b)

| | | | | | | | |
|---|---|---|---|---|---|---|---|
| 101 | Sample, signal Hold, reference | Sample, reference | Comparison | Hold, signal | Comparison | Hold, signal | Sample, signal Hold, reference | Sample, reference |
| 102 | Sample, reference | Comparison | Hold, signal | Sample, signal Hold, reference | Sample, reference | Sample, signal Hold, reference | Sample, reference | Comparison |
| 103 | Comparison | Hold, signal | Sample, signal Hold, reference | Sample, reference | Sample, signal Hold, reference | Sample, reference | Comparison | Hold, signal |

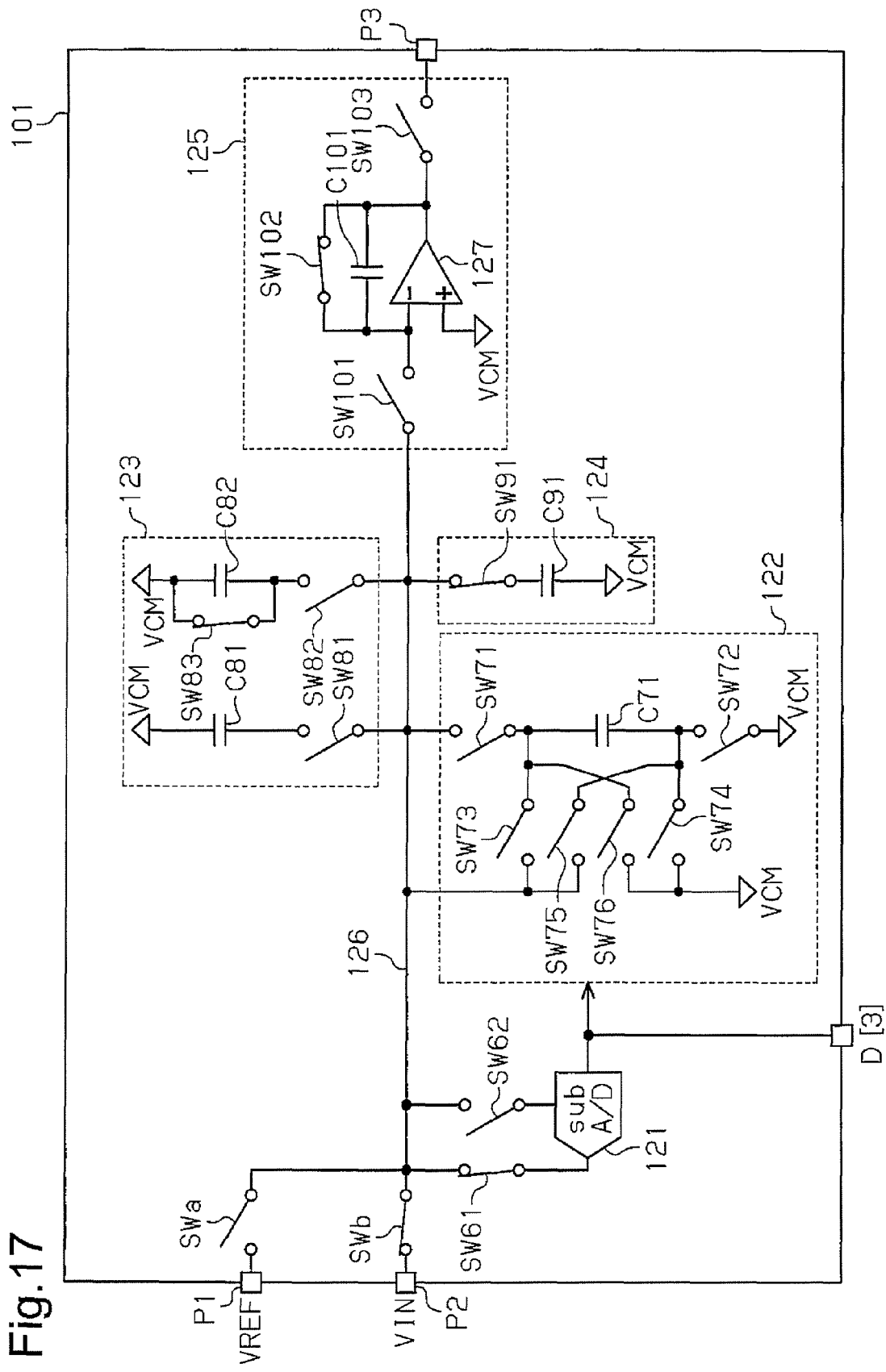

Fig.21

| Block | Swith or Comp | Sample.signal | Sample.reference | State Comparison | Hold.signal | Hold.reference |
|---|---|---|---|---|---|---|
| Sub A/D | SW61 | ON | OFF | OFF | OFF | OFF |
|  | SW62 | OFF | ON | OFF | OFF | OFF |
|  | — | ON | ON | ON | OFF | OFF |
| Signal Holding Circuit | SW91 | ON | OFF | OFF | ON | OFF |
| Sub D/A | SW71, SW72 | OFF | ON | OFF | OFF | OFF |
|  | SW73, SW74 | OFF | OFF | OFF | ON/OFF | OFF |
|  | SW75, SW76 | OFF | OFF | OFF | OFF/ON | OFF |
| Reference Holding Circuit | SW81 | OFF | ON | OFF | OFF | ON |
|  | SW82 | OFF | OFF | OFF | OFF | ON |
|  | SW83 | ON | OFF | OFF | OFF | OFF |
| Amplifier | SW101, SW103 | OFF | OFF | ON (OFF) | ON | ON |
|  | SW102 | ON | ON | OFF (ON) | OFF | OFF |

ANALOG-TO-DIGITAL CONVERTER CIRCUIT AND METHOD OF CONTROLLING ANALOG-TO-DIGITAL CONVERTER CIRCUIT

CROSS-REFERENCE TO RELATED APPLICATIONS

This application is based upon and claims the benefit of priority from prior Japanese Patent Application No. 2013-225494, filed on Oct. 30, 2013, the entire contents of which are incorporated herein by reference.

FIELD

The present disclosure relates to an analog-to-digital converter circuit.

BACKGROUND

Conventionally, an analog-to-digital converter circuit is mounted in a microcomputer or a system LSI. A pipeline-type analog-to-digital converter circuit is one of high-speed analog-to-digital converter circuits (for example, see Japanese Patent Laid-Open Publication No. 9-275342. The pipeline-type analog-to-digital converter circuit includes a plurality of analog-to-digital converters (A/D converters) coupled in series. The A/D converter of the first level compares an analog input voltage with a reference signal voltage and outputs a digital signal according to a result of the comparison and a voltage acquired by amplifying a differential voltage between the analog input voltage and the reference signal voltage using an amplifier. The A/D converter of the second level or any one of subsequent levels outputs a digital signal according to a result of a comparison between an output voltage of the previous level and a reference signal voltage and a voltage acquired by amplifying a differential voltage between the output voltage of the previous level and the reference signal voltage using an amplifier.

SUMMARY

However, the linearity of an analog-to-digital conversion may be decreased due to variations (for example, variations in a resistance value and/or variations in the amplification factor of an amplifier) of a device included in the analog-to-digital converter circuit, and a digital signal after the conversion may have undesirable linearity.

According to an aspect of the invention, an analog-to-digital converter circuit is provided. The analog-to-digital converter circuit includes a plurality of conversion stages that are cascaded to be coupled in series. Each of the plurality of conversion stages includes a signal holding circuit configured to hold an input voltage, an analog-to-digital converter configured to convert the input voltage into a digital signal based on a first reference voltage, a digital-to-analog converter configured to generate a first voltage according to the digital signal, the first reference voltage, and the input voltage, an amplifier configured to amplify the first voltage to generate an output voltage, and a reference holding circuit configured to hold a holding voltage that is in proportion to the first reference voltage. The amplifier is coupled to the reference holding circuit to receive and amplify the holding voltage to generate a second reference voltage.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

FIGS. 16(a) and 16(b) are schematic diagrams that illustrate state transitions of the conversion stage;

FIG. 17 is a circuit diagram of the conversion stage;

FIG. 21 is a schematic diagram that illustrates the operation states of a switch and a component of the conversion stage;

DESCRIPTION OF EMBODIMENTS

First Embodiment

Figure 1:
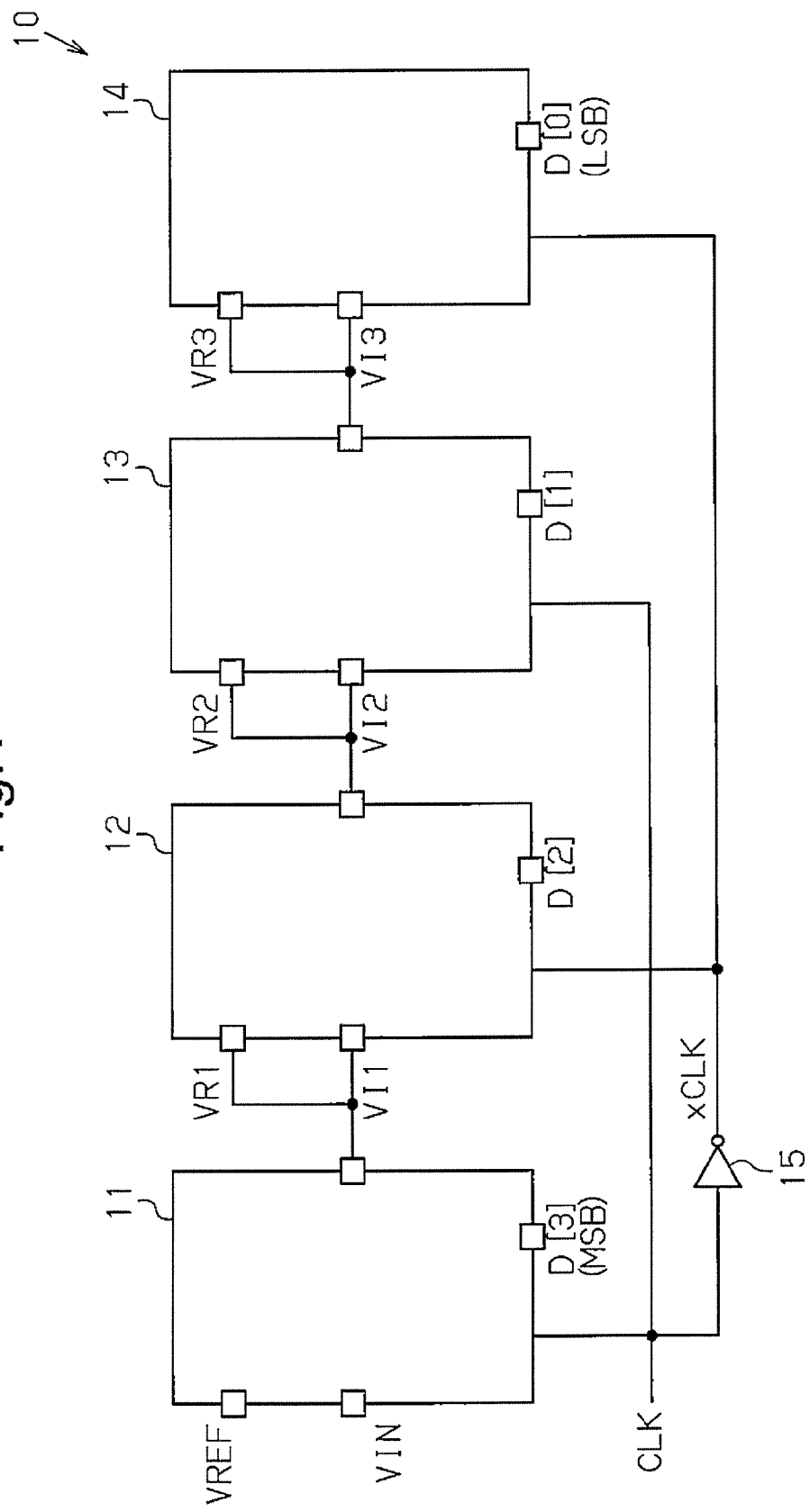
FIG. 1 is a block circuit diagram of an analog-to-digital converter circuit according to a first embodiment.

As illustrated in FIG. 1, an analog-to-digital converter circuit 10 performs an analog-to-digital conversion and outputs a digital signal D[3:0] of multiple bits (for example, four bits) according to an input signal voltage VIN.

The analog-to-digital converter circuit 10 has a plurality of (four in FIG. 1) of cascaded conversion stages 11 to 14. The conversion stages 11 to 14 respectively output digital signals D[3] to D[0] each having one bit. This analog-to-digital converter circuit 10 is a so-called pipeline type.

A clock signal CLK is supplied to conversion stages 11 and 13 of odd-number levels. The conversion stages 11 and 13 operate based on the clock signal CLK. For example, the conversion stages 11 and 13 are in a first operation state based on a clock signal CLK of an H level and are in a second operation state based on a clock signal CLK of an L level.

An inverted clock signal xCLK acquired by inverting the clock signal CLK using an inverter circuit 15 is supplied to conversion stages 12 and 14 of an even-number level. The conversion stages 12 and 14 operate based on the inverted clock signal xCLK. For example, the conversion stages 12 and 14 are in a first operation state based on an inverted clock signal xCLK of the H level and are in the second operation state based on an inverted clock signal xCLK of the L level.

A reference signal voltage VREF and an input signal voltage VIN are supplied to the conversion stage 11 of the first level. The conversion stage 11 converts the input signal voltage VIN into a digital signal D[3] based on the reference signal voltage VREF. The conversion stage 11, in the first operation state, outputs an output voltage VI1 based on the digital signal D[3], the reference signal voltage VREF, and the input signal voltage VIN. For example, when the digital signal D[3] is "1", the conversion stage 11 outputs an output voltage VI1 according to a voltage difference (residual voltage) between the reference voltage VREF and the input signal voltage VIN. In addition, when the digital signal D[3] is "0", the conversion stage 11 outputs an output voltage VI1 according to the input signal voltage VIN. The output voltage VI1 of the conversion stage 11 is an input signal voltage for the conversion stage 12 of the next level (downstream level). Thus, the output voltage VI1 will be described as the input signal voltage VI1. This similarly applies to the conversion stages 12 to 14. In addition, the conversion stage 11, in the second operation state, outputs a reference signal voltage VR1 that is generated based on the reference signal voltage VREF. In the conversion stage 11, the reference signal voltage VREF is an example of a first reference voltage, and the reference signal voltage VR1 is an example of a second reference signal voltage.

The conversion stage 12 of the second level converts the input signal voltage VI1 into a digital signal D[2] based on the reference signal voltage VR1 that is output from the conversion stage 11 of the previous level (upstream level). The conversion stage 12, in the first operation state, outputs an input signal voltage VI2 to be input to the conversion stage 13 of the next level based on the digital signal D[2], the reference signal voltage VR1, and the input signal voltage VI1. In addition, the conversion stage 12, in the second operation state, outputs a reference signal voltage VR2 that is generated based on the reference signal voltage VR1.

The conversion stage 13 of the third level, similar to the conversion stage 12 of the second level, converts the input signal voltage VI2 into a digital signal D[1] based on the reference signal voltage VR2 that is output from the conversion stage 12 of the previous level. The conversion stage 13, in the first operation state, outputs an input signal voltage VI3 to be input to the conversion stage 14 of the next level based on the digital signal D[1], the reference signal voltage VR2, and the input signal voltage VI2. In addition, the conversion stage 13, in the second operation state, outputs a reference signal voltage VR3 that is generated based on the reference signal voltage VR2.

The conversion stage 14 of the final level (fourth level) converts the input signal voltage VI3 into a digital signal D[0] based on the reference signal voltage VR3 that is output from the conversion stage 13 of the previous level. Next, an overview of the conversion stage 11 will be described. The conversion stages 12 and 13 of the second and third levels are the same as the first conversion stage 11, and thus, the description thereof will not be presented.

Figure 2A:
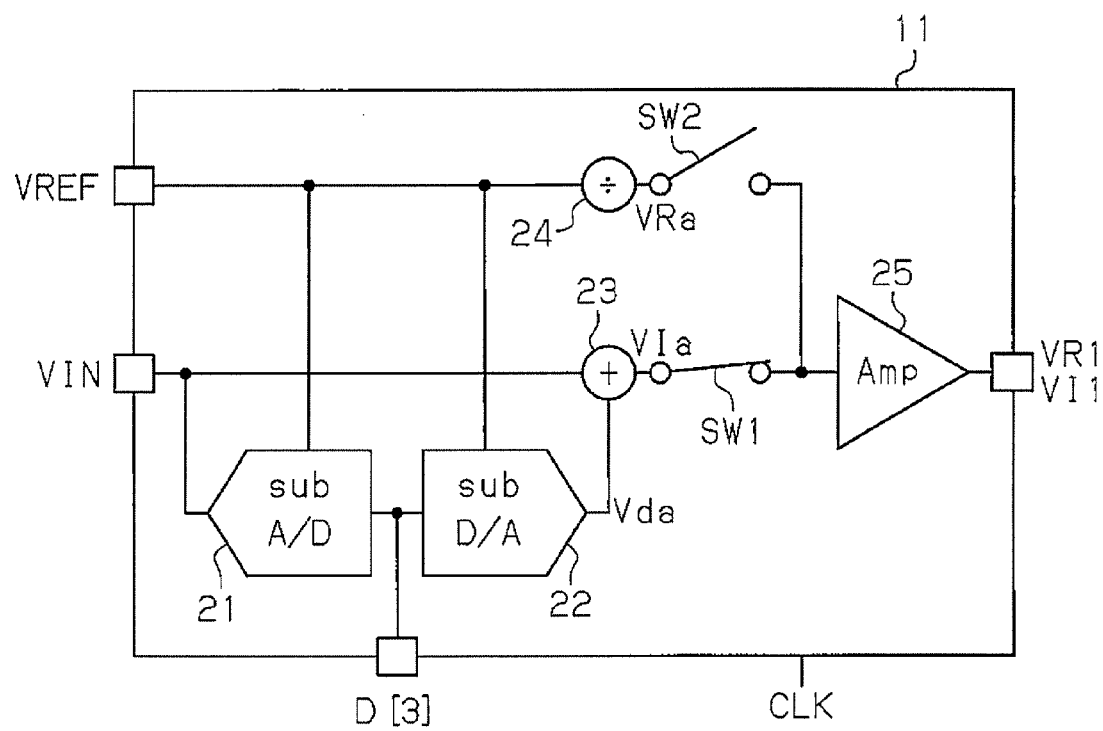
FIGS. 2(a) and 2(b) are block circuit diagrams of a conversion stage.

As illustrated in FIG. 2(a), the conversion stage 11 includes: a sub analog-to-digital (A/D) converter (denoted as "sub A/D" in the FIG. 21; a sub digital-to-analog (D/A) converter (denoted as "sub D/A" in the FIG. 22; an adder 23; a divider 24; an amplifier (denoted as "Amp" in the FIG. 25; and switches SW1 and SW2.

The reference signal voltage VREF and the input signal voltage VIN are supplied to the sub A/D converter 21. The sub A/D converter 21 converts the input signal voltage VIN into a digital signal D[3] of one bit based on the reference signal voltage VREF. The sub A/D converter 21 generates a threshold voltage Vth by dividing the reference signal voltage VREF into a half (=1/2) in accordance with the digital signal D[3] of one bit to be generated, compares the threshold voltage Vth with the input signal voltage VIN, and outputs the digital signal D[3] according to a result of the comparison. For example, the sub A/D converter 21 outputs the digital signal D[3] of "1" in a case where the input signal voltage VIN is higher than the threshold voltage Vth and outputs the digital signal D[3] of "0" in a case where the input signal voltage VIN is lower than the threshold voltage Vth.

The reference signal voltage VREF and the digital signal D[3] output from the sub A/D converter 21 are supplied to the sub D/A converter 22. The sub D/A converter 22 generates an output voltage Vda according to the digital signal D[3] based on the reference signal voltage VREF. The sub D/A converter 22, for example, includes a ladder resistor and a switch and outputs the output voltage Vda that is equal to the divided voltage according to the digital signal D[3]. For example, the sub D/A converter 22 selects a divided voltage that is acquired by dividing the reference signal voltage VREF into a half in accordance with the digital signal D[3] of "1" and outputs the output voltage Vda (=VREF/2) according to the divided voltage. In addition, the sub D/A converter 22 outputs the output voltage Vda that is equal to a low electric-potential voltage VSS in response to the digital signal D[3] of "0".

The adder 23 outputs a residual voltage VIa (=VIN−Vda) according to a result of addition of a negative output voltage Vda to the input signal voltage VIN, in other words, subtraction the output voltage Vda from the input signal voltage VIN based on the input signal voltage VIN and the output voltage Vda of the sub D/A converter 22. The residual voltage VIa output from the adder 23 is supplied to the amplifier 25 through the switch SW1.

The divider 24 generates a voltage VRa according to a result of dividing the reference signal voltage VREF by a predetermined value. Here, the predetermined value is a value that is set in accordance with the configuration of the conversion stage 11 and is a value that is set in accordance with the number of bits of the digital signal in the conversion stage 11. For example, the conversion stage 11 outputs the digital signal D[3] of one bit. The predetermined value is set to "2" in the divider 24. The divider 24 generates a voltage VRa (=VREF/2) acquired by dividing the reference signal voltage VREF in accordance with a set value. For example, the predetermined value (divisor) of the divider in the conversion stage outputting a digital signal of n bits is "2'''". The voltage VRa output from the divider 24 is supplied to the amplifier 25 through the switch SW2. The voltage VRa is an example of a holding voltage.

The switch SW1 and the switch SW2, for example, are turned on or off in a complementary manner in response to the clock signal CLK. For example, the switch SW1 is turned on in response to a clock signal CLK of the H level and is turned off in response to a clock signal CLK of the L level. The switch SW2 is turned off in response to a clock signal CLK of the H level and is turned on in response to a clock signal CLK of the L level. Accordingly, when the clock signal CLK is at the H level, the voltage VRa output from the divider 24 is supplied to the amplifier 25. On the other hand, when the clock signal CLK is at the L level, the voltage VIa output from the adder 23 is supplied to the amplifier 25.

The amplifier 25, for example, includes an operational amplifier that performs voltage amplification. The amplifier 25 amplifies a voltage supplied to the input terminal and outputs a voltage after the amplification. The amplification factor of the amplifier 25 is set in accordance with the conversion stage 11. For example, the conversion stage 11 generates a digital signal D[3] of one bit. Accordingly, the amplification factor of the amplifier 25 is set to "2" ($=2^1$). For example, the amplification factor of the amplifier in a conversion stage outputting a digital signal of n bits is $2^n$.

When the clock signal CLK is at the H level, the amplifier 25 is supplied with the voltage VIa that is output from the adder 23 through the switch SW1. The amplifier 25 outputs an input signal voltage VI1 generated by amplifying the voltage VIa. The voltage VIa supplied from the adder 23 or the output voltage Vda supplied from the sub D/A converter 22 is an example of a first voltage supplied to the amplifier 25. On the other hand, when the clock signal CLK is at the L level, the amplifier 25 is supplied with the voltage VRa that is output from the divider 24 through the switch SW2. The amplifier 25 outputs a reference signal voltage VR1 that is generated by amplifying the voltage VRa.

Figure 2B:
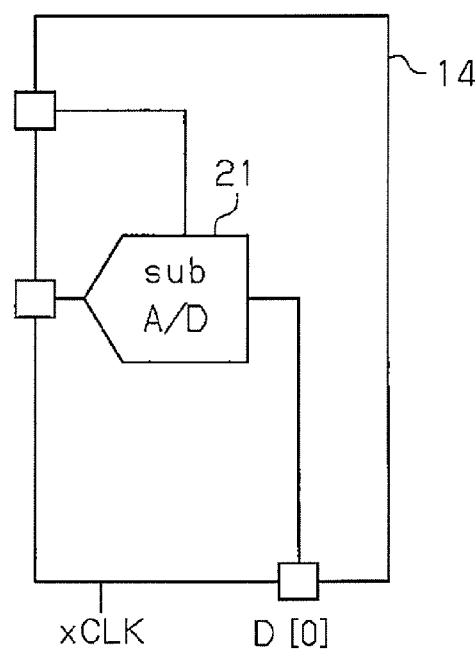

As illustrated in FIG. 2(b), the conversion stage 14 of the final level includes a sub A/D converter 21 that is subordinate thereto. The sub A/D converter 21 is supplied with the input signal voltage VI3 output from the conversion stage 13 illustrated in FIG. 1 and the reference signal voltage VR3. The sub A/D converter 21 outputs a digital signal D[0] of one bit according to the input signal voltage VI3 based on the reference signal voltage VR3.

Next, an example of a circuit of the conversion stage 11 will be described with reference to FIG. 3(a). The amplifier 25 of the conversion stage 11 includes: an operational amplifier 31, capacitors C11 and C12; and switches SW11 to SW15.

An input signal voltage VIN is supplied to a first terminal of each of the switches SW11 and SW12. Second terminals of the switches SW11 and SW12 are respectively coupled to the first terminals of the capacitors C11 and C12. The second terminals of the capacitors C11 and C12 are coupled together, and the coupling point thereof is coupled to a first terminal of the switch SW13 and a first terminal of the switch SW 14. A second terminal of the switch SW13 is coupled to an inverted input terminal of the operational amplifier 31. A second terminal of the switch SW14 is coupled to a wiring (hereinafter, may be simply referred to as a wiring VSS) to which a low electric potential voltage VSS is supplied. A non-inverted input terminal of the operational amplifier 31 is coupled to the wiring VSS. An output terminal of the operational amplifier 31 is coupled to a second terminal of the switch SW15, and a first terminal of the switch SW15 is coupled to a node disposed between the switch SW11 and the capacitor C11. For example, the capacitance values of the capacitors C11 and C12 are set to have the same value.

The adder 23 includes a switch SW31. The output voltage Vda of the sub D/A converter 22 is supplied to a first terminal of the switch SW31. A second terminal of the switch SW31 is coupled to a node disposed between the switch SW12 and the capacitor C12.

The divider 24 includes capacitors C21 and C22 and switches SW21 to SW23. The switches SW21 to SW23 are change-over switches, and each of the switches has a common terminal and two changeover terminals. The common terminal of the switch SW21 is coupled to a first terminal of the capacitor C21, and a second terminal of the capacitor C21 is coupled to the wiring VSS. A first changeover terminal of the switch SW21 is coupled to the wiring VSS. A second changeover terminal of the switch SW21 is coupled to a second changeover terminal of the switch SW22 and the inverted input terminal of the operational amplifier 31. The common terminal of the switch SW22 is coupled to a first terminal of the capacitor C22, and a first changeover terminal thereof is coupled to the wiring VSS. A second terminal of the capacitor C22 is coupled to a common terminal of the switch SW23. A first changeover terminal of the switch SW23 is supplied with the reference signal voltage VREF, and a second changeover terminal of the switch SW23 is coupled to an output terminal of the operational amplifier 31. The capacitance values (capacity ratios) of the capacitors C21 and C22 are set in accordance with a predetermined value of the divider 24. For example, the capacitance values of the capacitors C21 and C22 are set to have the same value.

The switches SW11 to SW15 and SW31 are turned on or off in response to the clock signal CLK. Each of the switches SW21 and SW23 has the common terminal coupled to a changeover terminal (the first changeover terminal or the second changeover terminal) according to the level of the clock signal CLK.

Figure 3A:
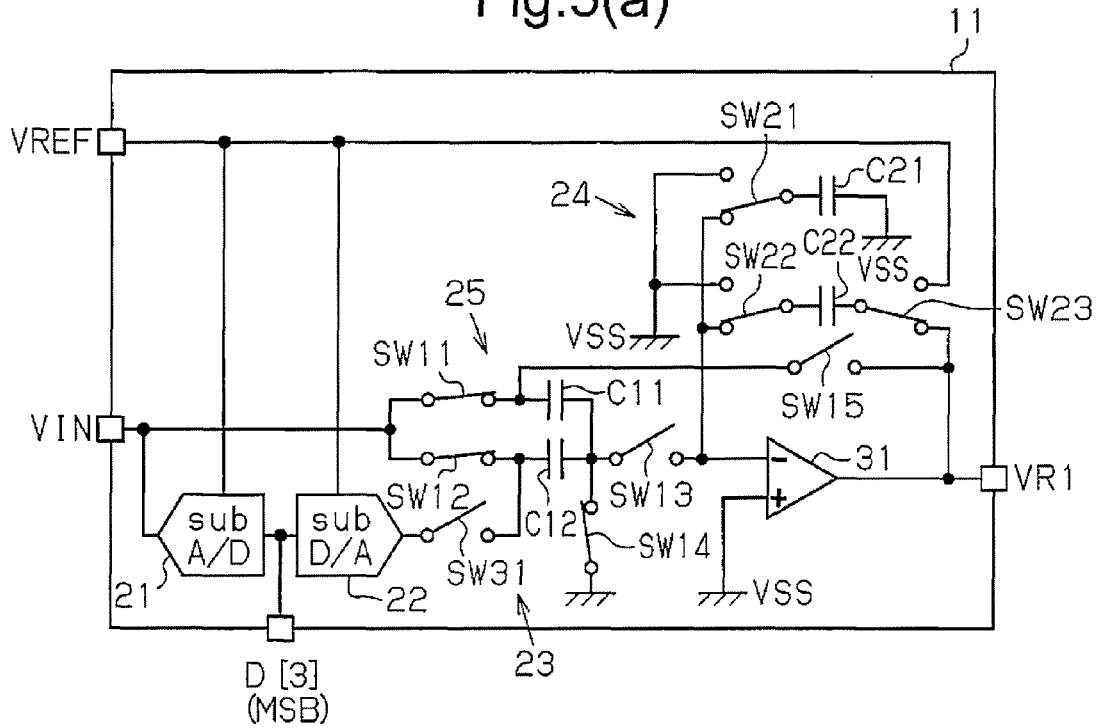
FIGS. 3(a) and 3(b) are schematic diagrams that illustrate the operations of the conversion stage.

FIG. 3(a) illustrates the state (second operation state) of the switches SW11 to SW31 in response to the clock signal CLK of the L level. In this state, the first terminals of the capacitors C11 and C12 of the amplifier 25 are supplied with the input signal voltage VIN through the switches SW11 and SW12 that are turned on, and the second terminals of the capacitors C11 and C12 are coupled to the wiring VSS through the switch SW14 that is turned on. Accordingly, the capacitors C11 and C12 accumulate electric charges according to the input signal voltage VIN. A circuit that is configured by the capacitors C11 and C12 and the switches SW11, SW12, and SW14 is an example of a signal holding circuit.

The first terminal of the capacitor C21 of the divider 24 and the first terminal of the capacitor C22 are coupled to the inverted input terminal of the operational amplifier 31. The second terminal of the capacitor C21 is coupled to the wiring VSS, and the second terminal of the capacitor C22 is coupled to the output terminal of the operational amplifier 31. Accordingly, the input terminal of the operational amplifier 31 is supplied with a voltage generated in the first terminals of the capacitors C21 and C22 in accordance with the electric charge accumulated in the capacitors C21 and C22. The operational amplifier 31 outputs a reference signal voltage VR1 acquired by amplifying the generated voltage in accordance with a gain (×2). The divider 24 is an example of a reference holding circuit. The voltage VRa is an example of a holding voltage.

Figure 3B:
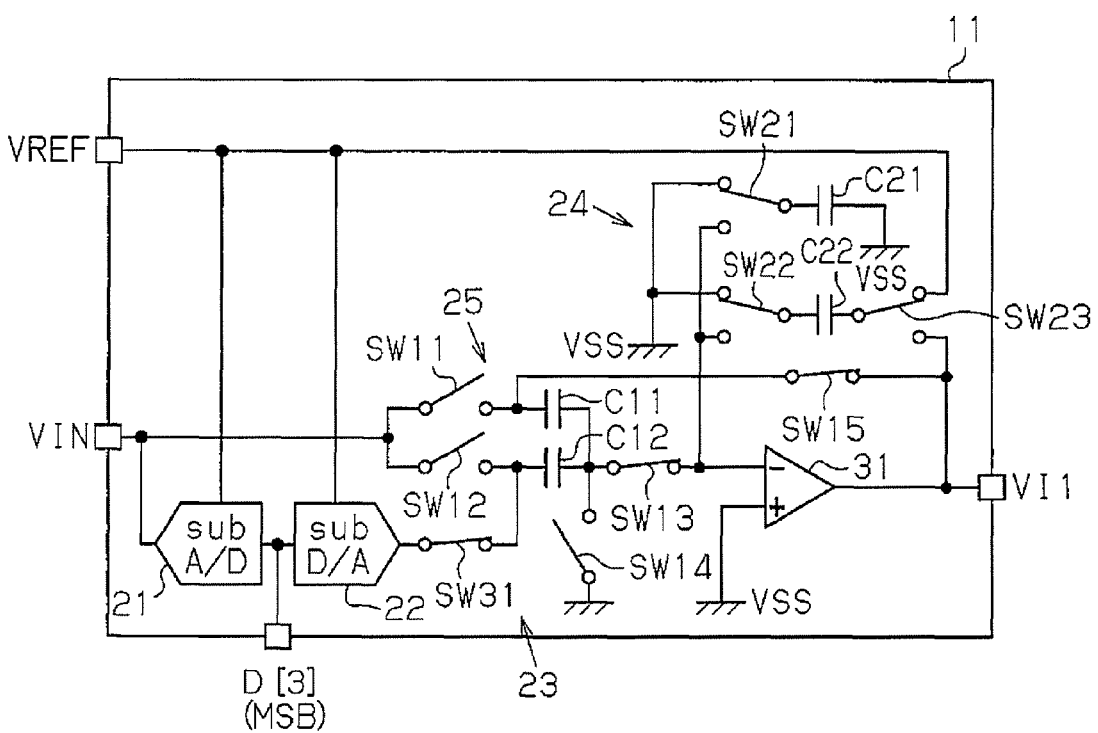

FIG. 3(b) illustrates the state (first operation state) of the switches SW11 to SW31 in response to the clock signal CLK of the H level. The switches SW11 and SW12 to which the first terminals of the capacitors C11 and C12 are coupled are turned off. As the switches SW13 and SW15 are turned on, the capacitor C11 is coupled between the output terminal and the input terminal of the operational amplifier 31. In addition, the output voltage Vda of the sub D/A converter 22 is supplied to the capacitor C12 through the switch SW31 that is turned on. At this time, since the capacitance values of the capacitors C11 and C12 are equal, the output voltage VI1 of the operational amplifier 31 is a voltage (=2VIN−Vda) acquired by subtracting the output voltage Vda of the sub D/A converter 22 from a voltage acquired by amplifying the input signal voltage VIN with the gain (×2).

In the divider 24, the first terminal of the capacitor C22 is coupled to the wiring VSS through the switch SW22, and the second terminal of the capacitor C22 is supplied with the reference signal voltage VREF through the switch SW23. Accordingly, the capacitor C22 accumulates electric charge according to the reference signal voltage VREF. The first terminal of the capacitor C21 is coupled to the wiring VSS through the switch SW21, and the second terminal of the capacitor C21 is coupled to the wiring VSS. Accordingly, both terminals of the capacitor C21 are reset to a low electric potential voltage VSS (0 V).

As illustrated in FIG. 3(a), when the clock signal CLK is at the L level, the first terminal of the capacitor C22 is coupled to the first terminal of the capacitor C21 through the switches SW22 and SW21. In addition, the first terminal of the capacitor C22 is coupled to the inverted input terminal of the operational amplifier 31 through the switch SW22. Accordingly, the electric charge accumulated in the capacitor C22 moves to the capacitor C21 through the switches SW22 and SW21. The capacitance value of the capacitor C21 is equal to the capacitance value of the capacitor C22. Accordingly, the input terminal of the operational amplifier 31 is supplied with a voltage (=VREF/2) acquired by dividing the reference signal voltage VREF into a half. At this time, the voltage supplied to the input terminal of the operational amplifier 31 is equal to the threshold voltage Vth of the sub A/D converter 21 (however, the sign is the opposite).

The second terminal of the capacitor C22 is coupled to the output terminal of the operational amplifier 31 through the switch SW23. Accordingly, the amplifier 25 performs inversion amplification of a half of the reference signal voltage VREF in accordance with the gain and outputs the reference signal voltage VR1. The amplifier 25 is an example of a switched capacitor amplifier.

Figure 4A:
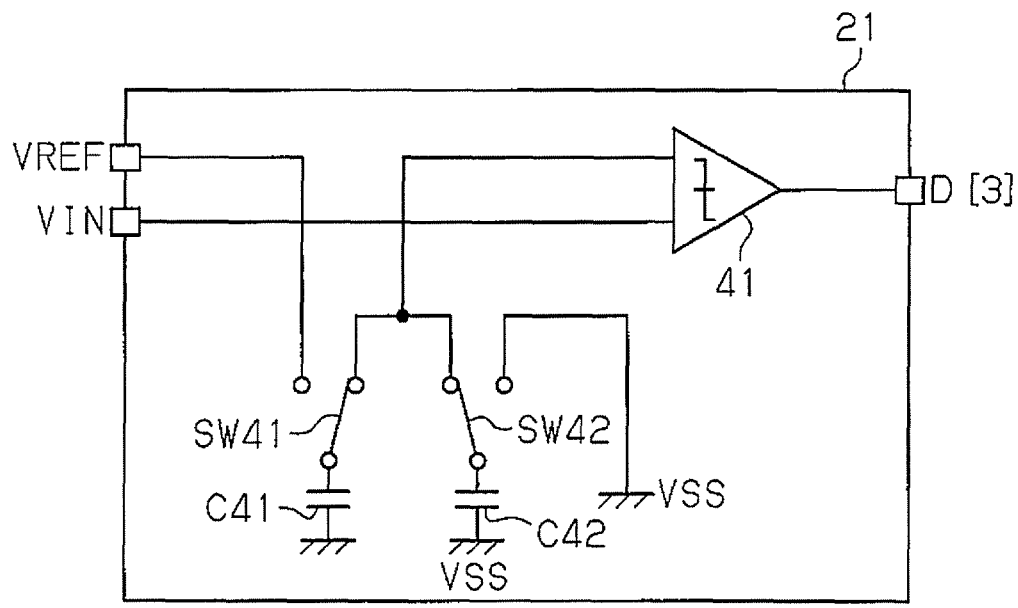
FIGS. 4(a) and 4(b) are diagrams that illustrate a sub A/D converter.

As illustrated in FIG. 4(a), the sub A/D converter 21 includes: a comparator 41, switches SW41 and SW42; and capacitors C41 and C42. Each of the switches SW41 and SW42 is a changeover switch that includes a common terminal, a first changeover terminal, and a second changeover terminal. The common terminals of the switches SW41 and SW42 are coupled to the first terminals of the capacitors C41 and C42, and the second terminals of the capacitors C41 and C42 are coupled to the wiring VSS. The first changeover terminal of the switch SW41 is supplied with the reference signal voltage VREF. The second terminal of the switch SW41 and the second changeover terminal of the switch SW42 are coupled to each other, and the coupling point thereof is coupled to a first input terminal of the comparator 41. A second input terminal of the comparator 41 is supplied with the input signal voltage VIN. A first terminal of the switch SW 42 is coupled to the wiring VSS. The capacitance value of the capacitor C41 and the capacitance value of the capacitor C42 are set to have the same value.

Each of the switches SW41 and SW42 has the common terminal coupled to the first changeover terminal or the second changeover terminal in response to the clock signal CLK.

For example, each of the switches SW41 and SW42 has the common terminal coupled to the second changeover terminal in response to a clock signal CLK of the H level and has the common terminal coupled to the first changeover terminal in response to a clock signal CLK of the L level.

Figure 4B:
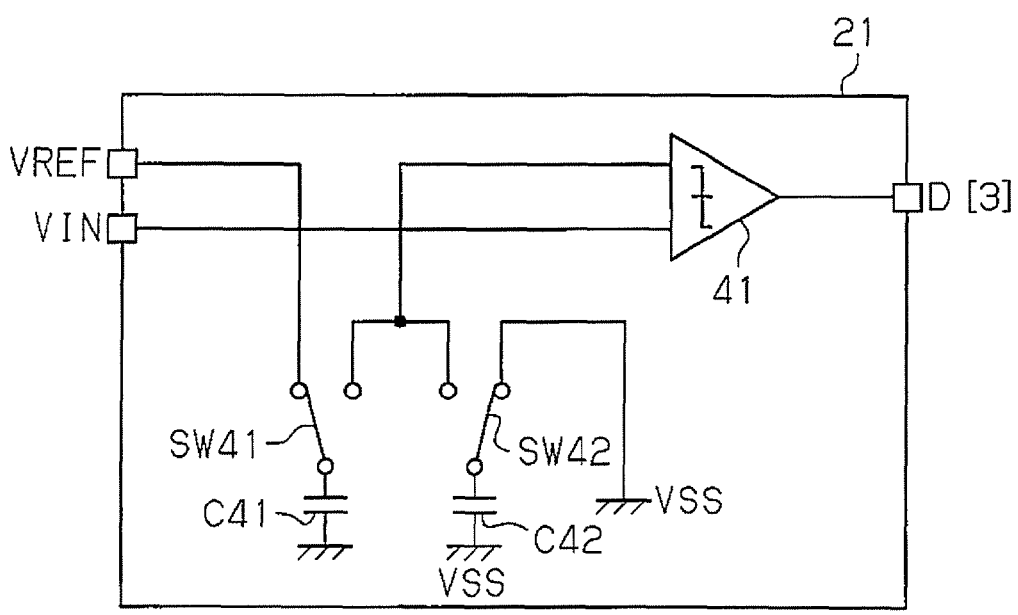

As illustrated in FIG. 4(b), each of the switches SW 41 and SW42 has the common terminal coupled to the first changeover terminal in response to a clock signal CLK of a first level (for example, the L level). At this time, the capacitor C41 accumulates electric charge according to the reference signal voltage VREF.

Next, as illustrated in FIG. 4(a), each of the switches SW41 and SW42 has the common terminal to the second changeover terminal in response to a clock signal CLK of a second level (for example, the H level). Then, a part of the electric charge accumulated in the capacitor C41 moves to the capacitor C42. Since the capacitance values of the capacitors C41 and C42 are the same, the amount of electric charge remaining in the capacitor C41 and the amount of electric charge moved to the capacitor C42 are the same. Accordingly, the threshold voltage Vth of a half (=VREF/2) of the reference signal voltage VREF is supplied to the comparator 41.

Figure 5:
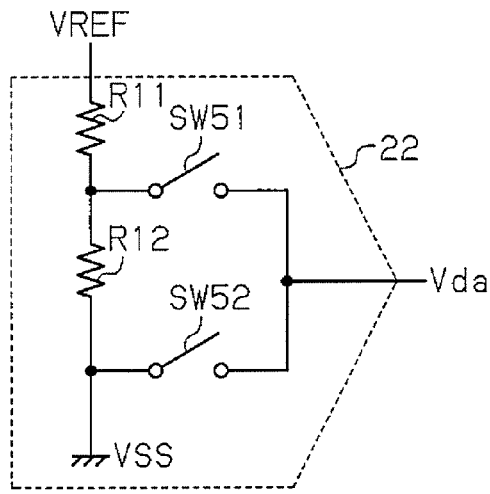
FIG. 5 is a circuit diagram of a sub D/A converter.

The comparator 41 compares the threshold voltage Vth and the input signal voltage VIN with each other and outputs a digital signal D[3] having a value according to a result of the comparison. As illustrated in FIG. 5, the sub D/A converter 22 includes resistors R11 and R12 and switches SW51 and SW52.

A first terminal of the resistor R11 is supplied with the reference signal voltage VREF, a second terminal of the resistor R11 is coupled to a first terminal of the resistor R12, and a second terminal of the resistor R12 is coupled to the wiring VSS. A first terminal of the switch SW51 is coupled to a node disposed between the resistor R11 and the resistor R12, and a first terminal of the switch SW52 is coupled to a node disposed between the second terminal of the resistor R12 and the wiring VSS. An output voltage VO1 is output from a coupling point at which the second terminals of the switches SW51 and SW52 are coupled together.

The switches SW51 and SW52 are turned on or off in accordance with a digital signal D[3]. For example, the switch SW51 is turned on in response to a digital signal D[3] of "1" and is turned off in response to a digital signal D[3] of "0". The switch SW52 is turned on in response to a digital signal D[3] of "0" and is turned off in response to a digital signal D[3] of "1". When the digital signal D[3] is "0", an output voltage V0 (=0 [V]) having the same level as the level of the wiring VSS to which the first terminal of the switch SW52 that is turned on is coupled is output. On the other hand, when the digital signal D[3] is "1", an output voltage VO that is the same as the voltage VREF/2 of a node to which the first terminal of the switch SW51 that is turned on is coupled is output.

Figures 7A, 7B:
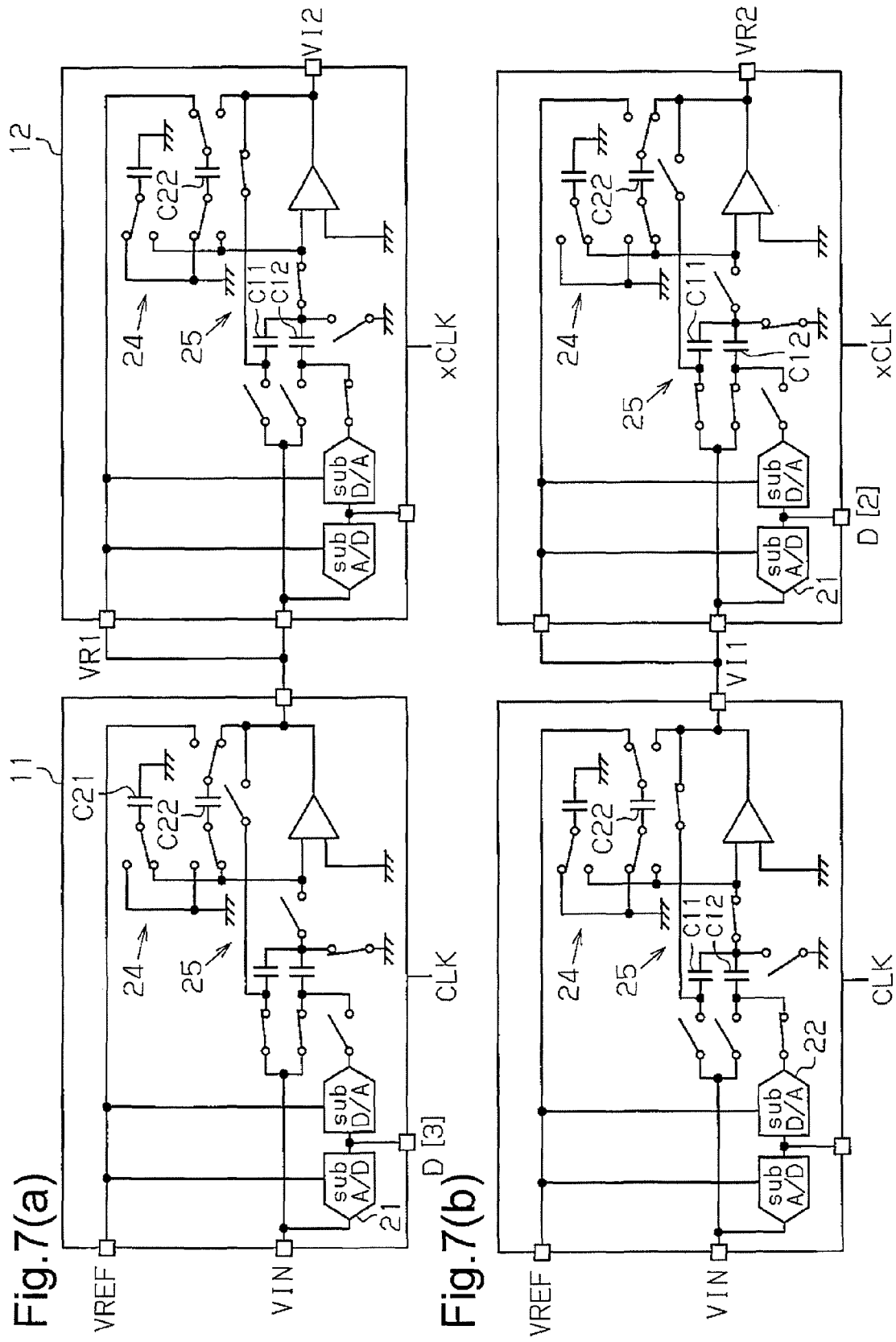
FIGS. 7(a) and 7(b) are schematic diagrams that illustrate the operation of the conversion stage.

Next, the operation of the A/D converter circuit 10 will be described with reference to FIGS. 7(a) and 7(b). In FIGS. 7(a) and 7(b), only reference numerals of members that are necessary for description are illustrated. For example, as illustrated in FIG. 7(a), the conversion stage 11 of the first level is in the second operation state (sample state) based on a clock signal CLK of the L level, and the conversion stage 12 of the second level is in the first operation state (hold state) based on an inverted clock signal xCLK of the H level.

In the conversion stage 11 that is in the second operation state (sample state), the amplifier 25 outputs the reference signal voltage VR1 according to the electric charge accumulated in the capacitors C21 and C22 of the divider 24. On the other hand, in the conversion stage 12 that is in the first operation state (hold state), the capacitor C22 of the divider 24 accumulates electric charge according to the reference signal voltage VR1 that is output from the conversion stage 11 of the previous level.

In addition, in the conversion stage 11 that is in the second operation state (sample state), the sub A/D converter 21 outputs a digital signal D[3] acquired by converting the input signal voltage VIN based on the reference signal voltage VREF. The capacitors C11 and C12 of the amplifier 25 accumulate electric charge according to the input signal voltage VIN.

Next, as illustrated in FIG. 7(b), the conversion stage 11 of the first level is in the first operation state (hold state) based on a clock signal CLK of the H level, and the conversion stage 12 of the second level is in the second operation state (sample state) based on an inverted clock signal xCLK of the L level.

In the conversion stage 11 that is in the first operation state (hold state), the amplifier 25 outputs the input signal voltage VI1 that is based on the output voltage of the sub D/A converter 22 and the electric charge accumulated in the capacitors C11 and C12. In the conversion stage 12 that is in the second operation state (sample state), the sub A/D converter 21 outputs a digital signal D[2] acquired by converting the input signal voltage VI1 based on the reference signal voltage VR1. The capacitors C11 and C12 of the amplifier 25 accumulate electric charge according to the input signal voltage VI1.

In this way, the conversion stage 11 generates a digital signal D[3] of one bit based on the reference signal voltage VREF and the input signal voltage VIN. The conversion stage 11 generates an input signal voltage VI1 according to the reference signal voltage VREF and the input signal voltage VIN based on the digital signal D[3]. In addition, the conversion stage 11 accumulates electric charge according to the reference signal voltage VREF in two capacitors C21 and C22. By amplifying a voltage according to the electric charge of one capacitor C22 using the amplifier 25, the reference signal voltage VR1 to be supplied to the conversion stage of the next level is generated.

The conversion stage 12 generates a digital signal D[2] of one bit based on the reference signal voltage VR1 and the input signal voltage VI1. The conversion stage 12 generates an input signal voltage VI2 according to the reference signal voltage VR1 and the input signal voltage VI1 based on the digital signal D[2]. In addition, the conversion stage 12 accumulates electric charge according to the reference signal voltage VR1 in the two capacitors C21 and C22. A voltage according to the electric charge of one capacitor C22 is amplified using the amplifier 25, and the reference signal voltage VR2 to be supplied to the conversion stage (the conversion stage 13 illustrated in FIG. 1) of the next level is generated.

Figure 8:
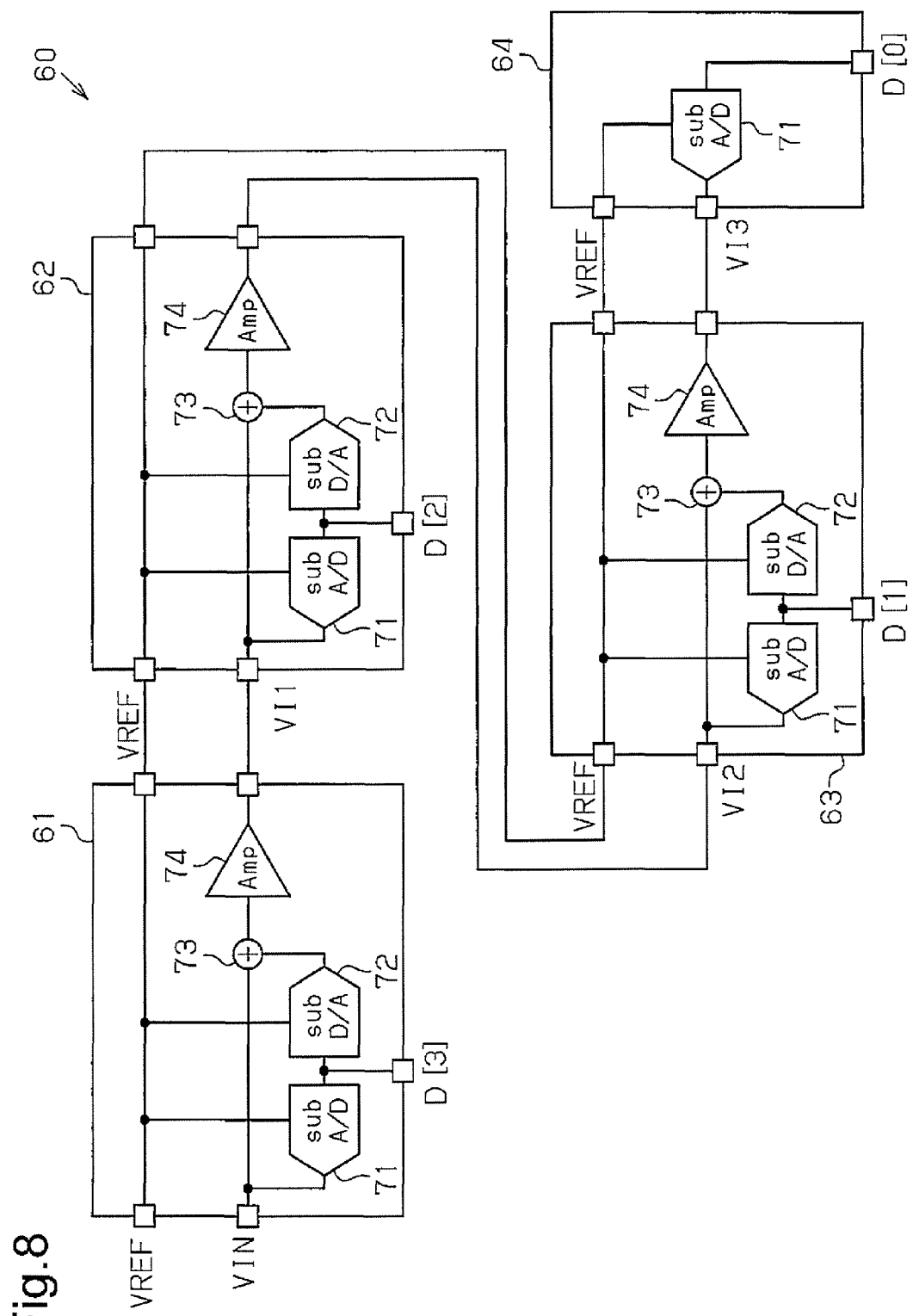
FIG. 8 is a circuit diagram of an analog-to-digital converter circuit of a comparative example.

Next, an A/D converter circuit of a comparative example will be described. As illustrated in FIG. 8, the A/D converter circuit 60 includes a plurality of (four in FIG. 8) conversion stages 61 to 64 that are cascaded to be coupled in series.

A conversion stage 61 of a first level includes: a sub A/D converter 71; a sub D/A converter 72; an adder 73; and an amplifier 74. The sub A/D converter 71 converts an input signal voltage VIN into a digital signal D[3] of one bit based on a reference signal voltage VREF. The sub D/A converter 72 outputs a voltage according to the digital signal D[3] based on the reference signal voltage VREF. The adder 73 generates a residual voltage based on the input signal voltage VIN and the output voltage of the sub D/A converter 72. The amplifier 74 amplifies the residual voltage with a predetermined amplification factor (for example, two) and outputs the input signal voltage VI1 to be input to a conversion stage 62 of the next level.

A conversion stage 62 of a second level is similar to the conversion stage 61 of the first level. In other words, the conversion stage 62 includes: a sub A/D converter 71; a sub D/A converter 72; an adder 73; and an amplifier 74. The sub A/D converter 71 converts the input signal voltage VI1 into a digital signal D[2] of one bit based on the reference signal voltage VREF. The sub D/A converter 72 outputs a voltage according to the digital signal D[2] based on the reference signal voltage VREF. The adder 73 generates a residual voltage based on the input signal voltage VI1 and the output voltage of the sub D/A converter 72. The amplifier 74 amplifies the residual voltage with a predetermined amplification factor (for example, two) and outputs an input signal voltage VI2 corresponding to a conversion stage 63 of the next level.

The conversion stage 63 of a third level is similar to the conversion stage 62 of the second level. In other words, the conversion stage 63 includes: a sub A/D converter 71; a sub D/A converter 72; an adder 73; and an amplifier 74. The sub A/D converter 71 converts an input signal voltage VI2 into a digital signal D[1] of one bit based on a reference signal voltage VREF. The sub D/A converter 72 outputs a voltage according to the digital signal D[1] based on the reference signal voltage VREF. The adder 73 generates a residual voltage based on the input signal voltage VI2 and the output voltage of the sub D/A converter 72. The amplifier 74 amplifies the residual voltage with a predetermined amplification factor (for example, two) and outputs an input signal voltage VI3 corresponding to a conversion stage 64 of the next level.

A conversion stage 64 of the final level (fourth level) includes a sub A/D converter 71. The sub A/D converter 71 converts the input signal voltage VI3 into a digital signal D[0] of one bit based on the reference signal voltage VREF.

In the case of an A/D converter circuit 60 illustrated in FIG. 8, the reference signal voltage VREF is supplied to each of conversion stages 61 to 64. The conversion stages 61 to 64 respectively generate digital signals D[3] to D[0] according to results of comparisons between a threshold voltage Vth (=VREF/2) according to the reference signal voltage VREF and input voltages. The amplifier 74 of each of the conversion stages 61 to 64 generates an output voltage by amplifying a difference between the input voltage and the output voltage of the sub D/A converter 22. Accordingly, the range of input voltages for the conversion stages 61 to 64 correspond to the reference signal voltage VREF.

However, an error in the gain of the amplifier 74 causes a difference between the range of the input voltage and the range of the output voltage. For example, in a case where the gain of the amplifier 74 is less than "2", the range of the output voltage is smaller than the range of the input voltage.

Figure 9:
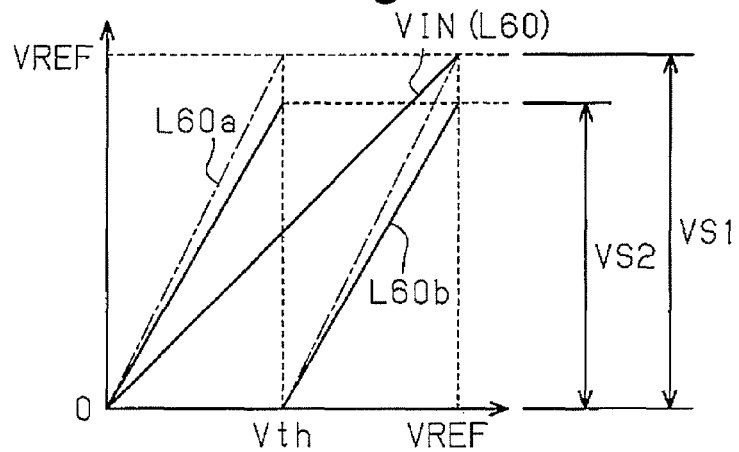
FIG. 9 is a characteristic diagram of an output voltage with respect to an input voltage.

For example, a solid line L60 represented in FIG. 9 illustrates the input signal voltage VIN. A range VS1 represents values that may be taken by the input signal voltage VIN. A dashed line L60a illustrated in FIG. 9 illustrates the output voltage VOUT with respect to the input signal voltage VIN when the gain of the amplifier 74 is "2". In FIG. 9, the horizontal axis and the vertical axis represent voltages. The range VS1 of the input signal voltage VIN is "0" [V] to the reference signal voltage VREF. In a case where the input signal voltage VIN is lower than the threshold voltage Vth, the output voltage VOUT is generated by amplifying the input signal voltage VIN. On the other hand, in a case where the input signal voltage VIN is higher than the threshold voltage Vth, the output voltage VOUT is generated by amplifying a result acquired by subtracting the threshold voltage Vth from the input signal voltage VIN.

In a case where the gain of the amplifier 74 is less than "2", as illustrated by a solid line L60b in FIG. 9, the range VS2 in which the output voltage VOUT changes is smaller than the range VS1 of the input voltage that is set in accordance with the reference signal voltage VREF.

Figure 10A:
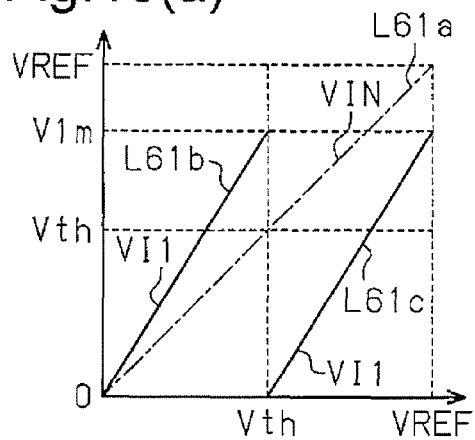
FIGS. 10(a) to 10(c) are characteristic diagrams of an input voltage and an output voltage of a comparative example.
Figure 10B:
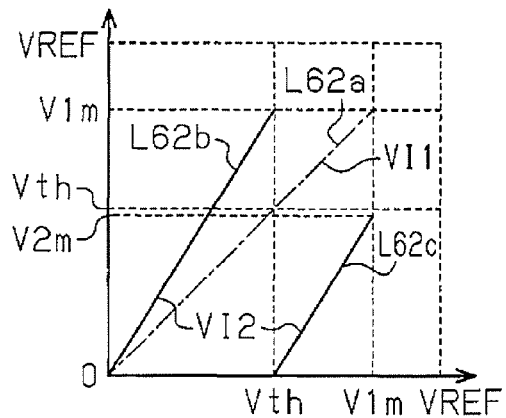
Figure 10C:
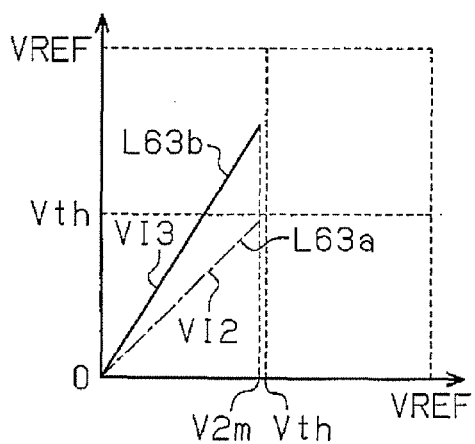

FIGS. 10(a) to 10(c) illustrate the relations between the input voltages and the output voltages of the conversion stages 61 to 63. In the waveforms of the input voltages illustrated in FIGS. 10(a) to 10(c), the horizontal axis and the vertical axis represent the input voltage, and, in the waveforms of the output voltages, the horizontal axis represents the input voltage, and the vertical axis represents the output voltage.

FIG. 10(a) illustrates the relation between the input signal voltage VIN and the output voltage VI1 of the conversion stage 61 (see FIG. 8) of the first level. A dashed line L61a illustrates the input signal voltage VIN, and solid lines L61b and L61c illustrate the output voltage VI1. The input signal voltage VIN changes from "0" [V] to the reference signal voltage VREF. When the input signal voltage VIN is lower than the threshold voltage Vth, the sub A/D converter 71 of the conversion stage 61 outputs a digital signal D[3] of "0". The amplifier 74 outputs the output voltage VI1 illustrated by the solid line L61b.

On the other hand, when the input signal voltage VIN is higher than the threshold voltage Vth, the sub A/D converter 71 outputs a digital signal D[3] of "1". The amplifier 74 outputs the output voltage VI1 illustrated by the solid line L61c.

In FIG. 10(a), a maximum value V1m of the output voltage VI1 is an upper limit of the input signal voltage VI1 of the conversion stage 62 (see FIG. 8) of the next level. In other words, in the conversion stage 61, the range of the input signal voltage VI1 is 0 [V] to the maximum value V1m.

FIG. 10(b) illustrates the relation between the input signal voltage VI1 and the output voltage VI2 of the conversion stage 62 (see FIG. 8) of the second level. A dashed line L62a illustrates the input signal voltage VI1, and solid lines L62b and L62c illustrate the output voltage VI2. As described above, the input signal voltage VI1 is in the range of "0" [V] to the maximum value V1m of the output voltage VI1 of the first level.

When the input signal voltage VI1 is lower than the threshold voltage Vth, the sub A/D converter 71 of the conversion stage 62 outputs a digital signal D[2] of "0". The amplifier 74 outputs the output voltage VI2 illustrated by the solid line L62b. The range of the input signal voltage VI1 is 0 [V] to the threshold voltage Vth. Accordingly, the range of the output voltage VI2 illustrated by the solid line L62b, similar to FIG. 10(a), is "0" [V] to the maximum value V1m. In this case, the operation of the conversion stage 63 of the next level (third level) is similar to that of the conversion stage 62 of the second level.

On the other hand, when the input signal voltage VI1 is higher than the threshold voltage Vth, the sub A/D converter 71 outputs a digital signal D[2] of "1". The amplifier 74 outputs the output voltage VI2 illustrated by the solid line L62c. The range of the input signal voltage VI1 is the threshold voltage Vth to the maximum value V1m. Accordingly, the range of the output voltage VI2 illustrated by the solid line L62c is 0 [V] to a maximum value V2m corresponding to the maximum value V1m.

FIG. 10(c) illustrates the relation between the input signal voltage VI2 and the output voltage VI3 of the conversion stage 63 (see FIG. 8) of the third level. A dashed line L63a illustrates the input signal voltage VI2, and a solid line L63b illustrates the output voltage VI3. As described above, the input signal voltage VI2 is in the range of "0" [V] to the maximum value V2m of the output voltage VI2 of the second level.

In this conversion stage 63, the maximum value V2m of the input signal voltage VI2 is less than the threshold voltage Vth. Accordingly, the sub A/D converter 71 of the conversion stage 63 outputs a digital signal D[1] of "0" but does not output a digital signal D[1] of "1". Accordingly, in the A/D converter circuit 60 illustrated in FIG. 8, a monotonously increasing characteristic may not be acquired.

In contrast to this, each of the conversion stages 11 to 14 of the converter circuit 10 illustrated in FIG. 1 divides the reference signal voltage in accordance with the number of bits of the digital signal and amplifies the divided voltage using the amplifier 25, thereby generating a reference signal voltage of the next level.

For example, in the conversion stage 11 of the first level illustrated in FIG. 3(a), the sub A/D converter 21 generates a digital signal D[3] of one bit by comparing the threshold voltage Vth set in accordance with the reference signal voltage VREF with the input signal voltage VIN. The threshold voltage Vth of the sub A/D converter 21 is a voltage of a half of the reference signal voltage VREF.

As illustrated in FIG. 3(b), the conversion stage 11 of the first level accumulates electric charge according to the reference signal voltage VREF in one capacitor C22 and electrically couples the capacitor C21 to the capacitor C22. Since the capacitance values of both the capacitors C21 and C22 are the same, a voltage according to the electric charge accumulated in one capacitor C22 is a half of the reference signal voltage VREF. The amplifier 25 amplifies the voltage according to the electric charge accumulated in the capacitor C22 and outputs the reference signal voltage VR1.

Figure 6A:
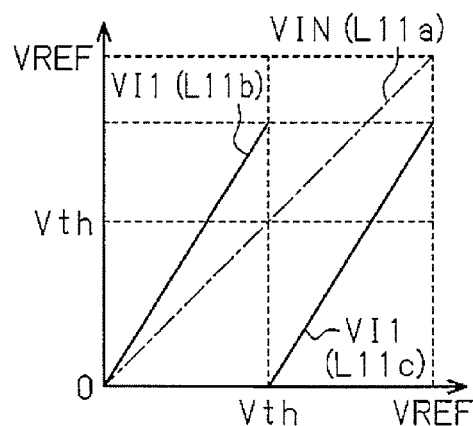
FIGS. 6(a) and 6(b) are characteristic diagrams of an input voltage and an output voltage.
Figure 6B:
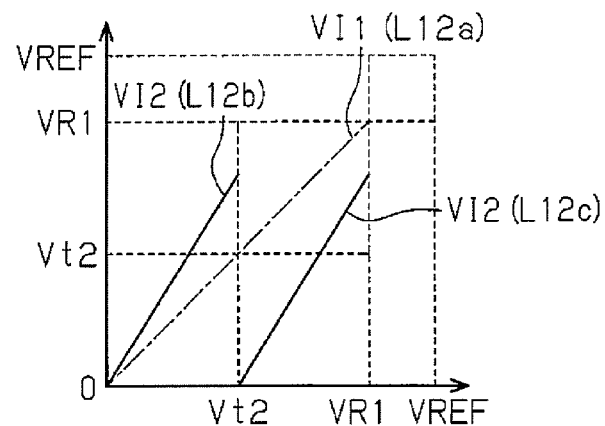

FIGS. 6(a) and 6(b) illustrate the relation between the input voltage and the output voltage (residual voltage) of the conversion stage according to a first embodiment. In the waveforms of the input voltages illustrated in FIGS. 6(a) and 6(b), the horizontal axis and the vertical axis represent the input voltage, and, in the waveform of the output voltage, the horizontal axis is the input voltage, and the vertical axis is the output voltage (residual voltage).

In the conversion stage 11 of the first level, the sub A/D converter 21 compares the input signal voltage VIN denoted by a dashed line L11a illustrated in FIG. 6(a) with the threshold voltage Vth that is based on the reference signal voltage VREF and, when the input signal voltage VIN is lower than the threshold voltage Vth, outputs a digital signal D[3] of "0". The amplifier 25 outputs the input signal voltage VI1 denoted by a solid line L11b illustrated in FIG. 6(a). On the other hand, when the input signal voltage VIN is higher than the threshold voltage Vth, the sub A/D converter 21 outputs a digital signal D[3] of "1". The amplifier 25 outputs an input signal voltage VI1 denoted by a solid line L11c. In addition, the amplifier 25 outputs a reference signal voltage VR1 based on the reference signal voltage VREF. The reference signal voltage VR1 is the same as the maximum value of the input signal voltage VI1.

In the conversion stage 12 of the second level, the sub A/D converter 21 compares the input signal voltage VI1 of the previous level with a threshold voltage Vt2 that is based on the reference signal voltage VR1 and, when the input signal voltage VI1 denoted by a dashed line L12a illustrated in FIG. 6(b) is lower than the threshold voltage Vt2, outputs a digital signal D[2] of "0". The amplifier 25 outputs an input signal voltage VI2 denoted by a solid line L12b illustrated in FIG. 6(b). On the other hand, when the input signal voltage VI1 is higher than the threshold voltage Vt2, the sub A/D converter 21 outputs a digital signal D[2] of "1". The amplifier 25 outputs an input signal voltage VI2 denoted by a solid line L12c. In addition, the amplifier 25 outputs a reference signal voltage VR2 based on the reference signal voltage VR1. The reference signal voltage VR2 is the same as the maximum value of the input signal voltage VI2.

In this way, the conversion stage 12 of the second level outputs the input signal voltage VI2 that changes similarly when the input signal voltage VI1 is lower than the threshold voltage Vt2 and when the input signal voltage VI1 is higher than the threshold voltage Vt2. The conversion stage 13 (see FIG. 1) of the third level compares the input signal voltage VI2 with the threshold voltage that is based on the reference signal voltage VR2. In the conversion stage 13 of the third level, the input signal voltage VI2 exceeds the threshold voltage. Accordingly, in the A/D converter circuit 10 illustrated in FIG. 1, the digital signal D[n] monotonously increases with respect to a change (increase) in the input signal voltage VIN.

The range of the voltage between conversion stages that are cascaded to be coupled in series will be described. The amplifier of each conversion stage uses a negative feedback. The transfer function of the amplifier 25 using a negative feedback is $H=A/(1+\beta A)$. Here, $\beta$ is a feedback coefficient, and A is a gain of the amplifier. For example, when amplification of two times is performed by the amplifier 25, $\beta=0.5$.

Accordingly, it is preferable that the range of the input signal voltage VI1 output from the conversion stage 11 of the first level and the range of the input voltage for the conversion stage 12 of the second level coincide with each other. This similarly applies to the conversion stages 12 to 14 of the second level and subsequent levels.

In the A/D converter circuit 60 illustrated in FIG. 8, the input signal voltage VIN is in the range of "0" [V] to the reference signal voltage VREF. In the A/D converter circuit 60 illustrated in FIG. 8, when a maximum value of the input signal voltage VIN is denoted by VIF, the range of the input signal voltage VI1 in the conversion stage 61 of the first level is $VI1=VIF \times A/(1+\beta A)$. Accordingly, the ratio VOFb/VIFa of the output voltage range VOFb of the conversion stage 61 of the first level to the input voltage range VIFa of the conversion stage 62 of the second level is $VOFb/VIFa=(VIF \times A/(1+\beta A))/VREF$. A maximum value of the input signal voltage VIN in the conversion stage 61 of the first level is the reference signal voltage VREF. Accordingly, the above-described equation may be represented as $VOFb/VIFa=A/(1+\beta A)$.

As above, in the A/D converter circuit 60 of the comparative example, the output voltage range of the conversion stage 61 of the first level is smaller than the input voltage range of the conversion stage 62 of the second level. This similarly applies to the conversion stages 63 and 64 of the second level and the subsequent level.

On the other hand, the A/D converter circuit 10 according to the first embodiment, similar to the input signal voltage VIN, outputs the reference signal voltage VR1 that is based on the reference signal voltage VREF from the amplifier 25. Accordingly, the input voltage range VIFa of the conversion stage 12 of the second level is $VIFa=VREF \times A/(1+\beta A)$. The output voltage range VOFb of the conversion stage 11 of the first level, similar to the A/D converter circuit 60 illustrated in FIG. 8, is $VOFb=VIF \times A/(1+\beta A)$. Accordingly, similar to the A/D converter circuit 60 illustrated in FIG. 8, the ratio VOFb/VIFa of the output voltage range VOFb of the conversion stage 11 of the first level to the input voltage range VIFa of the conversion stage 12 of the second level is $VOFb/VIFa=(VIF \times A/(1+\beta A))/(VREF \times A/(1+\beta A))=1$.

As above, in the A/D converter circuit 10 according to the first embodiment, the output voltage range of the conversion stage 11 of the first level and the input voltage range of the conversion stage of the second level coincide with each other. In other words, the conversion stage 11 of the first level generates the voltage VRa (=VREF/2) that is based on the reference signal voltage VREF and outputs the reference signal voltage VR1, which is acquired by amplifying the voltage VRa using the amplifier 25, of the conversion stage 12 of the next level, thereby setting the input voltage range according to the input signal voltage VI1. In this way, according to the A/D converter circuit 10 of the first embodiment, a monotonously increasing characteristic may be acquired.

According to the first embodiment, the following advantages may be obtained.

(1-1) The conversion stage 11 of the first level converts the input signal voltage VIN into a digital signal D[3] based on the reference signal voltage VREF. The conversion stage 11 generates the input signal voltage VI1 for the conversion stage 12 of the next level by amplifying a difference between the reference signal voltage VREF and the input signal voltage VIN based on the digital signal D[3] by using the amplifier 25. In addition, the conversion stage 11 generates the voltage VRa according to the amplification factor of the amplifier 25 based on the reference signal voltage VREF and amplifies the voltage VRa using the amplifier 25, thereby generating the reference signal voltage VR1 for the conversion stage 12 of the next level. The conversion stage 12 of the second level converts the input signal voltage VI1 into the digital signal D[2] based on the reference signal voltage VR1.

In this way, after the voltage VRa generated based on the reference signal voltage VREF is amplified using the amplifier 25 generating the input signal voltage VI1 for the next level, the reference signal voltage VR1 of the downstream level is generated. Accordingly, without precisely setting the amplification factor of the amplifier 25 in accordance with the reference signal voltage VREF, the range of the input signal voltage VI1 in the conversion stage 12 and the range of the reference signal voltage VR1 in the conversion stage 12 may be configured to coincide with each other. Also in the conversion stage 13, similar to the conversion stage 12, the range of the input signal voltage and the range of the reference signal voltage may be configured to coincide with each other. Accordingly, in the A/D converter circuit 10, a digital signal D[3:0] that monotonously increases with respect to a change in the input signal voltage VIN may be acquired. In other words, the A/D converter circuit 10 having excellent linearity for the digital signal D[3:0] may be obtained.

(1-2) In order to precisely set the range of the input signal voltage VI1 for the conversion stage 12 in accordance with the reference signal voltage VREF, an amplifier having a high gain is necessary in the conversion stage 11. In a plurality of conversion stages that are cascaded to be coupled in series, similarly, high-gain amplifiers are necessary. Such high-gain amplifiers cause an increase in the occupancy area of the A/D converter circuit and an increase in the power consumption thereof.

In contrast to this, the A/D converter circuit 10 according to the first embodiment may configure the range of the input signal voltage and the range of the reference signal voltage for each of the conversion stage 12 and the like to coincide with each other without using high-gain amplifiers. Accordingly, an increase in the occupancy area or the power consumption may be suppressed.

Second Embodiment

Figure 11:
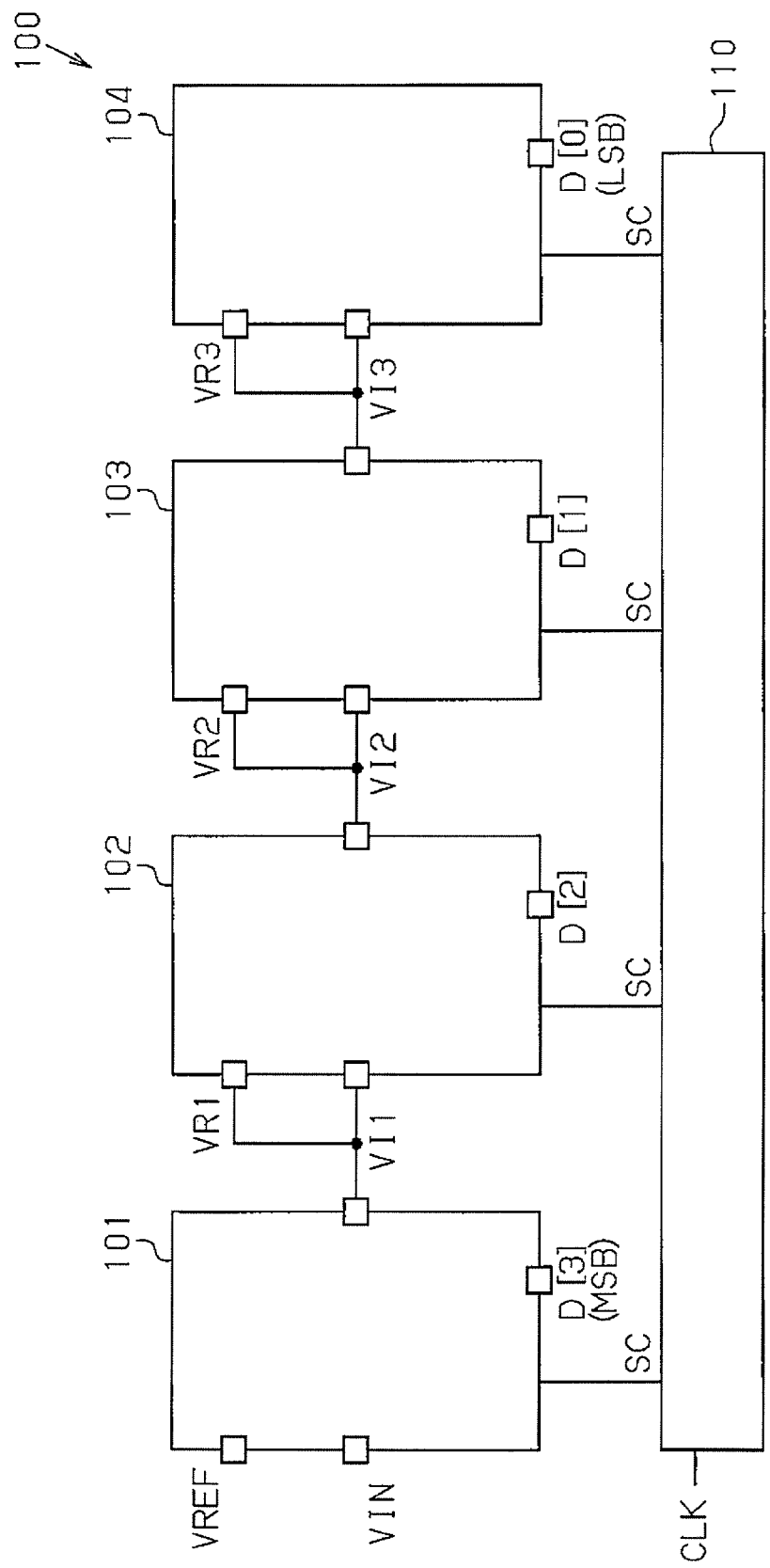
FIG. 11 is a block circuit diagram of an analog-to-digital converter circuit according to a second embodiment.

As illustrated in FIG. 11, an analog-to-digital converter circuit 100 includes: a plurality of (four in FIG. 11) conversion stages 101 to 104; and a control circuit 110 that controls the conversion stages 101 to 104.

The control circuit 110 generates control signals SC used for controlling the operation states (converted states) of the conversion stages 101 to 104 based on a clock signal CLK. In addition, the control circuit 110 generates control signals SC such that a pipeline process is performed by the conversion stages 101 to 104.

The conversion stages 101 to 104 operate based on the control signals SC generated by the control circuit 110 and generate digital signals D[3] to D[0]. The conversion stage 101 of a first level converts an input signal voltage VIN into a digital signal D[3] based on a reference signal voltage VREF. In addition, the conversion stage 101 generates an input signal voltage VI1 according to the reference signal voltage VREF and the input signal voltage VIN based on the digital signal D[3]. Furthermore, the conversion stage 101 generates a reference signal voltage VR1 based on the reference signal voltage VREF.

Similarly, the conversion stage 102 of a second level converts the input signal voltage VI1 into a digital signal D[2] based on the reference signal voltage VR1 and the input signal voltage VI1 generated by the conversion stage 101 of the first level. In addition, the conversion stage 101 generates an input signal voltage VI2 according to the reference signal voltage VR1 and the input signal voltage VI1 based on the digital signal D[2]. Furthermore, the conversion stage 101 generates a reference signal voltage VR2 based on the reference signal voltage VR1.

Similarly, the conversion stage 103 of a third level converts the input signal voltage VI2 into a digital signal D[1] based on the reference signal voltage VR2 and the input signal voltage VI2 generated by the conversion stage 102 of the previous level. In addition, the conversion stage 103 generates an input signal voltage VI3 according to the reference signal voltage VR2 and the input signal voltage VI2 based on the digital signal D[1]. Furthermore, the conversion stage 103 generates a reference signal voltage VR3 based on the reference signal voltage VR2.

The conversion stage 104 of a final level converts the input signal voltage VI3 into a digital signal D[0] based on the reference signal voltage VR3 and the input signal voltage VI3 generated by the conversion stage 103 of the previous level.

Figure 12:
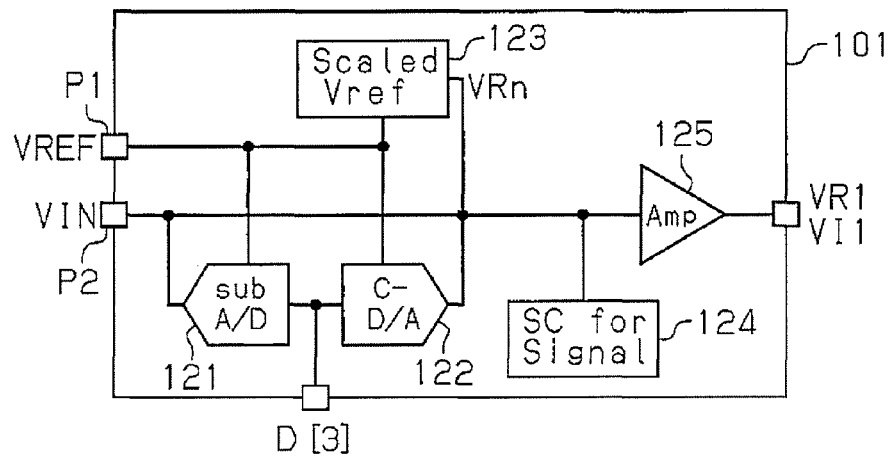
FIG. 12 is a block circuit diagram of a conversion stage.

As illustrated in FIG. 12, the conversion stage 101 of the first level includes: a sub A/D converter (denoted by "sub A/D" in the FIG. 121; a sub D/A converter (denoted by "C-D/A" in the FIG. 122; a reference holding circuit (denoted by "Scaled Vref" in the FIG. 123; a signal holding circuit (denoted by "SC for Signal") 124; and an amplifier (denoted by "Amp" in the FIG. 125.

An external input terminal P1 of the conversion stage 101 is supplied with the reference signal voltage VREF. In addition, an external input terminal P2 of the conversion stage 101 is supplied with the input signal voltage VIN. The reference signal voltage VREF is supplied to the reference holding circuit 123. The reference holding circuit 123 generates a reference signal voltage VRn according to the amplification factor of the amplifier 125 based on the reference signal voltage VREF. The amplifier 125 generates a reference signal voltage VR1 acquired by amplifying the reference signal voltage VRn. This reference signal voltage VR1 is supplied to the conversion stage 102 (see FIG. 11) of the next downstream level.

The input signal voltage VIN is supplied to the signal holding circuit 124. The signal holding circuit 124 holds electric charge according to the input signal voltage VIN. In addition, the input signal voltage VIN is supplied to the sub A/D converter 121. The sub A/D converter 121 is supplied with the reference signal voltage VREF. The sub A/D converter 121 converts the input signal voltage VIN into a digital signal D[3] of one bit based on the reference signal voltage VREF. For example, the sub A/D converter 121 holds electric charge according to the input signal voltage VIN. In addition, the sub A/D converter 121 holds electric charge according to the reference signal voltage VREF. The sub A/D converter 121 compares both electric charges with each other and outputs the digital signal D[3] according to a result of the comparison. The digital signal D[3] is supplied to the sub D/A converter 122.

The sub D/A converter 122, for example, is an electric charge sharing-type sub D/A converter. The sub D/A converter 122 is supplied with the reference signal voltage VREF. The sub D/A converter 122 performs addition of or subtraction between the electric charge held by the signal holding circuit 124 and the electric charge according to the reference signal voltage VREF in accordance with the digital signal D[3] and generates an input signal voltage VIn according to a result of the calculation.

The amplifier 125 generates an input signal voltage VI1 acquired by amplifying the input signal voltage VIn. This input signal voltage VI1 is supplied to the conversion stage 102 (see FIG. 11) of a next level. As described above, the conversion stage 101 makes transitions to a plurality of conversion states and generates the input signal voltage VI1 according to the input signal voltage VIN and the reference signal voltage VREF and a reference signal voltage VR1 according to the reference signal voltage VREF.

Each of the conversion stage 102 of the second level and the conversion stage 103 of the third level illustrated in FIG. 11 is the same as the conversion stage 101 of the first level, and thus, a drawing and description corresponding thereto will not be presented. The conversion stage 104 of the final stage illustrated in FIG. 11, similar to the conversion stage 14 illustrated in FIG. 2(b), includes a sub A/D converter 121 and converts the input signal voltage VI3 into a digital signal D[0] based on the reference signal voltage VR3.

Figure 13:
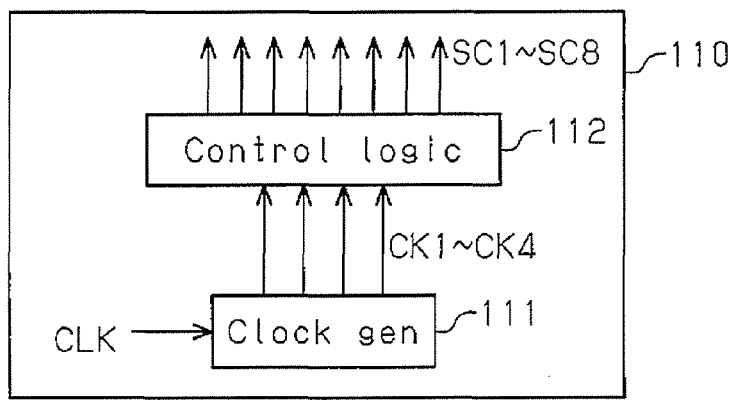
FIG. 13 is a block circuit diagram of a control circuit.

As illustrated in FIG. 13, the control circuit 110 includes a clock signal generating circuit (denoted by "Clock gen" in the FIG. 111 and a control signal generating circuit (denoted by "Control logic" in the FIG. 112. The clock signal generating circuit 111 generates a plurality of (four in the figure) state control signals CK1 to CK4 according to conversion states of the conversion stage 101 based on the clock signal CLK.

Figure 14:
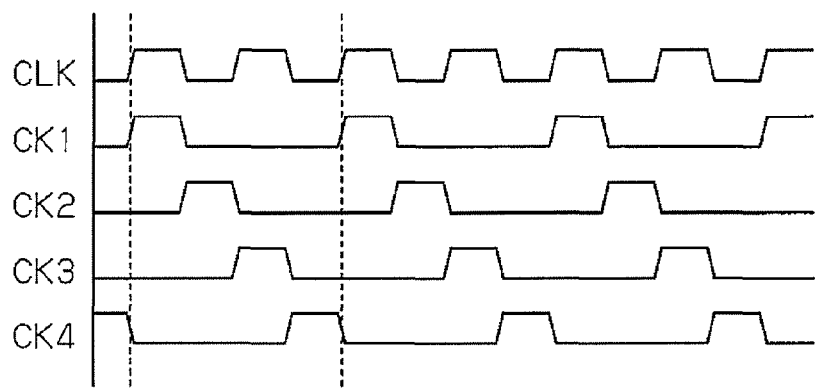
FIG. 14 is a waveform diagram of a state control signal.
Figure 15C:
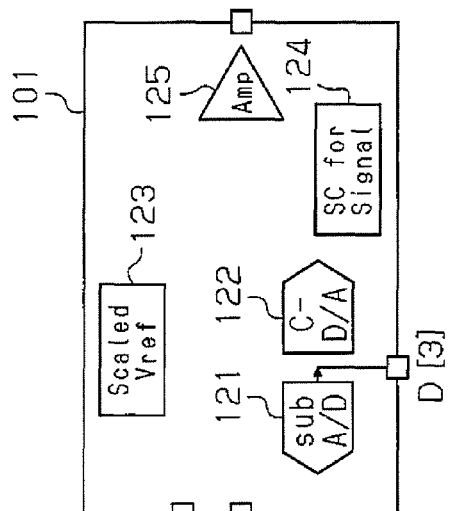
FIGS. 15(a) to 15(e) are schematic diagrams that illustrate operation states of the conversion stage.
Figure 15B:
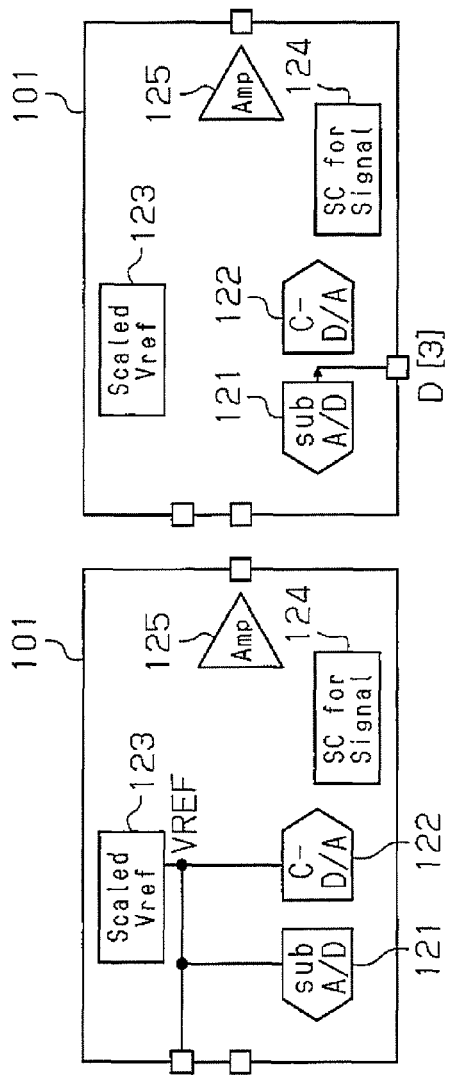
Figure 15A:
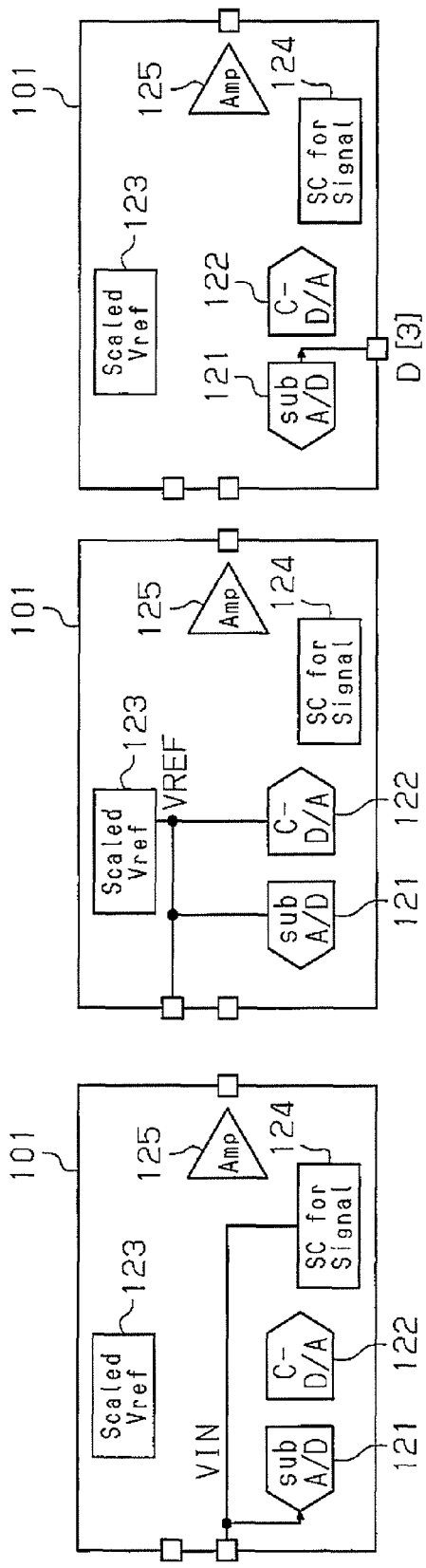
Figure 15E:
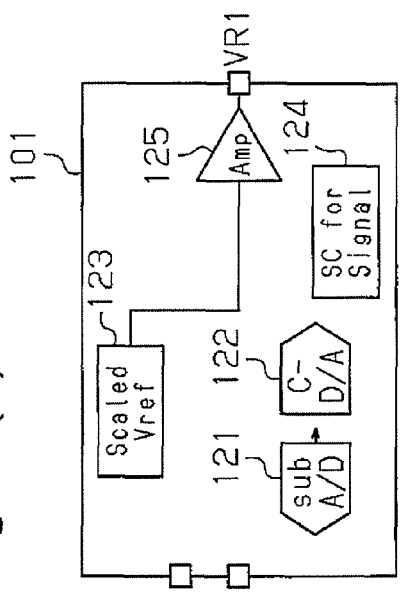
Figure 15D:
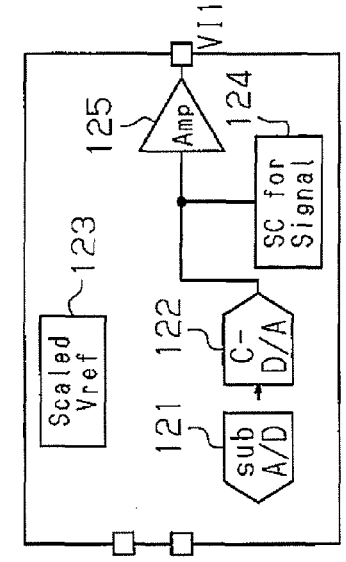

As illustrated in FIG. 14, the clock signal generating circuit 111 generates the four state control signals CK1 to CK4 having mutually-different periods of the H level. In each of the state control signals CK1 to CK4, a period of the H level, for example, is a half of the period of the clock signal CLK.

The control signal generating circuit 112 generates switch control signals SC1 to SC8 used for controlling a plurality of switches included in the conversion stage 101 based on the state control signals CK1 to CK4. The control signal SC illustrated in FIG. 11 includes such switch control signals SC1 to SC8.

For example, the sub A/D converter 121 of the conversion stage 101 illustrated in FIG. 12 includes a switch that is controlled for holding the reference signal voltage VREF and a switch that is controlled for holding the input signal voltage VIN. The sub D/A converter 122, the reference holding circuit 123, the signal holding circuit 124, and the amplifier 125 are similarly configured.

An overview of the operation performed in each conversion state will be described. In a sample signal state (Sample.signal State) (first state) illustrated in FIG. 15(*a*), the sub A/D converter 121 and the signal holding circuit 124 hold the input signal voltage VIN. In a sample reference state (Sample.reference State) (second state) illustrated in FIG. 15(*b*), the reference holding circuit 123, the sub A/D converter 121, and the sub D/A converter 122 hold the reference signal voltage VREF. In a comparison state (Comparison State) (third state) illustrated in FIG. 15(*c*), the sub A/D converter 121 generates a digital signal D[3] according to the held input signal voltage VIN and the reference signal voltage VREF. In a hold signal state (Hold.signal State) (fourth state) illustrated in FIG. 15(*d*), the sub D/A converter 122 outputs an input signal voltage VIn based on the input signal voltage VIN held by the signal holding circuit 124, the held reference signal voltage VREF, and the digital signal D[3], and the amplifier 125 amplifies the input signal voltage VIn and outputs the input signal voltage VI1. In a hold reference state (Hold.reference State) (fifth state) illustrated in FIG. 15(*e*), the reference holding circuit 123 outputs a reference signal voltage VRn according to the held reference signal voltage VREF, and the amplifier 125 outputs a reference signal voltage VR1 acquired by amplifying the reference signal voltage VRn.

FIGS. 15(*a*) to 15(*e*) do not represent the sequence of the conversion states. For example, in the hold reference state illustrated in FIG. 15(*e*), a reference signal voltage VR1 according to the reference signal voltage VREF held by the reference holding circuit 123 is output from the amplifier 125. Accordingly, simultaneously with the hold reference state, a state in which the reference holding circuit 123 and the amplifier 125 are not used, for example, the sample signal state illustrated in FIG. 15(*a*) may be formed. In addition, the hold reference state may be formed simultaneously with the comparison state illustrated in FIG. 15(*c*).

Accordingly, each conversion stage outputs a digital signal of one bit according to one conversion cycle including periods in which four conversion states are formed. Each conversion stage repeatedly performs each process according to the conversion cycle and outputs one of the digital signals D[3] to D[0] at each conversion cycle.

The conversion state in each conversion stage and the sequence of the conversion states are set in accordance with the operations of the conversion states. For example, in the conversion stage 101 illustrated in FIG. 12, in the comparison state illustrated in FIG. 15(*c*), the sub A/D converter 121 outputs a digital signal D[3] of one bit. In the hold signal state illustrated in FIG. 15(*d*), the sub D/A converter 122 adds/subtracts the held reference signal voltage VREF to/from the input signal voltage VIN held by the signal holding circuit 124 based on the digital signal D[3] of one bit and outputs the input signal voltage VIn. Accordingly, between the comparison state and the hold signal state, the sample signal state in which the input signal voltage VIN is held may not be formed.

In addition, one conversion stage outputs a reference signal voltage and an output voltage according to the residual voltage to the next conversion stage. Accordingly, each of the conversion stages 102 to 104 of the second level and subsequent levels is in a state in which the reference signal voltage and the output voltage output from the conversion stage 101, 102, or 103 of the previous level are received. For example, when one conversion stage is in the hold reference state, the conversion stage of the next level is in the sample reference state. In addition, when one conversion stage is in the hold signal state, the conversion stage of the next level is in the sample signal state.

FIG. 16(*a*) illustrates an example of the conversion states of the conversion stages 101 to 104. In FIG. 16(*a*), the upper level illustrates transitions of the states of the conversion stage 101 of the first level, the middle level illustrates transitions of states of the conversion stage 102 of the second level, and the lower level illustrates transitions of states of the conversion stage 103 of the third level.

For example, the state of the conversion stage 101 of the first level transitions in the sequence of the sample signal state, the comparison state/the hold reference state, the sample reference state, and the hold signal state. When the conversion stage 101 of the first level is in the hold signal state, the conversion stage 102 of the second level is in the sample signal state. Accordingly, the input signal voltage VI1 generated by the conversion stage 101 of the first level is received by the conversion stage 102 of the second level. When the conversion stage 102 of the second level is in the hold reference state, the conversion stage 103 of the third level is in the sample reference state. Accordingly, the reference signal voltage VR2 generated by the conversion stage 102 of the second level is received by the conversion stage 103 of the third level.

As illustrated in FIG. 16(*b*), control of each conversion stage may be performed such that the hold reference state is formed simultaneously with the sample signal state. For example, control of the conversion stage 101 of the first level may be performed such that the conversion stage 101 of the first level transits in the sequence of the sample signal state/the hold reference state, the sample reference state, the comparison state, and the hold signal state.

By controlling the states of the conversion stages in this way, the output voltage and the reference signal voltage generated by the conversion stage of the previous level may be received by the conversion stage of the next level. In addition, by configuring transitions of four conversion states in one A/D conversion cycle, a time required for one A/D conversion cycle may be shortened to be less than that of a case where five conversion states are formed at mutually different timings.

Next, an example of circuits of the conversion stage will be described. As illustrated in FIG. 17, the conversion stage 101 of the first level includes: a sub A/D converter 121; a sub D/A converter 122; a reference holding circuit 123; a signal holding circuit 124; an amplifier 125; and switches SWa, SWb, SW61, and SW62.

An external input terminal P1 of the conversion stage 101 is supplied with the reference signal voltage VREF. In addition, an external input terminal P2 of the conversion stage 101 is supplied with the input signal voltage VIN. The external input terminal P1 is coupled to a first terminal of the switch SWa, and a second terminal of the switch SWa is coupled to a supply path 126. Similarly, the external input terminal P2 is coupled to a first terminal of the switch SWb, and a second terminal of the switch SWb is coupled to the supply path 126. Accordingly, the supply path 126 is supplied with the reference signal voltage VREF through the switch SWa that is turned on. In addition, the supply path 126 is supplied with the input signal voltage VIN through the switch SWb that is turned on.

The conversion stage 101 illustrated in FIG. 17 supplies the reference signal voltage VREF and the input signal voltage VIN to the sub A/D converter 121, the sub D/A converter 122, the reference holding circuit 123, the signal holding circuit 124, and the amplifier 125 through one supply path 126. The conversion stage may be configured to include supply paths that respectively correspond to the reference signal voltage VREF and the input signal voltage VIN.

The switch SWa is controlled in accordance with timing at which the reference signal voltage VREF is held by the reference holding circuit 123 and the like. The switch SWb is controlled in accordance with timing at which the input signal voltage VIN is held by the signal holding circuit 124 and the like. Accordingly, the supply path 126 supplies the reference signal voltage VREF and the input signal voltage VIN at mutually different timings.

The sub A/D converter 121 is coupled to the supply path 126 through the switches SW61 and SW62. The switch SW62 is controlled in accordance with the supply timing of the reference signal voltage VREF. The switch SW61 is controlled in accordance with the supply timing of the input signal voltage VIN. The sub A/D converter 121 holds the reference signal voltage VREF that is input through the switch SW62. The sub A/D converter 121 outputs a digital signal D[3] of one bit in accordance with a result of a comparison between the input signal voltage VIN input through the switch SW61 and the held reference signal voltage VREF.

The sub D/A converter 122, for example, is an electric charge sharing-type sub D/A converter. The sub D/A converter 122 includes a capacitor C71 and switches SW71 to SW76. A first terminal (an upper terminal in the figure) of the capacitor C71 is coupled to a first terminal of the switch SW71, and a second terminal of the switch SW71 is coupled to the supply path 126. A second terminal (a lower terminal in the figure) of the capacitor C71 is coupled to a first terminal of the switch SW72, and a second terminal of the switch SW72 is supplied with a common voltage VCM. The common voltage VCM, for example, is the ground (=0 V).

In addition, the first terminal of the capacitor C71 is coupled to a first terminal of the switch SW73 and a first terminal of the switch SW76. A second terminal of the switch SW73 is coupled to the supply path 126, and a second terminal of the switch SW76 is supplied with the common voltage VCM.

Furthermore, a second terminal of the capacitor C71 is coupled to a first terminal of the switch SW74 and a first terminal of the switch SW75. A second terminal of the switch SW74 is supplied with the common voltage VCM, and a second terminal of the switch SW76 is coupled to the supply path 126.

As the switches SW71 and SW72 are turned on, and the switches SW73 to SW76 are turned off, the sub D/A converter 122 accumulates electric charge according to the reference signal voltage VREF in the capacitor C71. The switches SW73 to SW76 are turned on or off in accordance with the output signal (digital signal D[3]) of the sub A/D converter 121. The sub D/A converter 122 generates a differential voltage between the input signal voltage VIN held by the signal holding circuit 124 to be described later and the reference signal voltage VREF in accordance with the control of the switches SW73 to SW76.

The reference holding circuit 123 includes capacitors C81 and C82 and switches SW81 to SW83. A first terminal of the capacitor C81 is supplied with the common voltage VCM, a second terminal of the capacitor C81 is coupled to a first terminal of the switch SW81, and a second terminal of the switch SW81 is coupled to the supply path 126. Similarly, a first terminal of the capacitor C82 is supplied with the common voltage VCM, a second terminal of the capacitor C82 is coupled to a first terminal of the switch SW82, and a second terminal of the switch SW82 is coupled to the supply path 126. The switch SW83 is coupled between both terminals of the capacitor C82. The switch SW83 discharges the electric charge accumulated in the capacitor C82, thereby causing the electric potentials of both the terminals of the capacitor C82 to be the same.

The reference holding circuit 123 accumulates electric charge according to the voltage (reference signal voltage VREF) supplied to the supply path 126 at timing when the switch SW81 is turned on in the capacitor C81. The electric charge accumulated in the capacitor C81 moves to the capacitor C82 as the switch SW82 is turned on. In this way, a holding voltage acquired by dividing the reference signal voltage VREF is generated between both terminals of the capacitor C81.

The signal holding circuit 124 includes a capacitor C91 and a switch SW91. A first terminal of the switch SW91 is coupled to the supply path 126, a second terminal of the switch SW91 is coupled to a first terminal of the capacitor C91, and a second terminal of the capacitor C91 is supplied with the common voltage VCM. The signal holding circuit 124 accumulates electric charge according to the voltage (input signal voltage VIN) supplied to the supply path 126 at timing when the switch SW91 is turned on in the capacitor C91.

The amplifier 125 includes: an operational amplifier 127; a capacitor C101; and switches SW101 to SW103. A first terminal of the switch SW101 is coupled to the supply path 126, and a second terminal of the switch SW101 is coupled to an inverted input terminal of the operational amplifier 127. A non-inverted input terminal of the operational amplifier 127 is supplied with the common voltage VCM. A capacitor C101 is coupled between an output terminal and the inverted input terminal of the operational amplifier 127. The switch SW102 is coupled to the capacitor C101 in parallel therewith. An output terminal of the operational amplifier 127 is coupled to a first terminal of the switch SW103, and a second terminal of the switch SW103 is coupled to an external output terminal P3.

Figure 18:
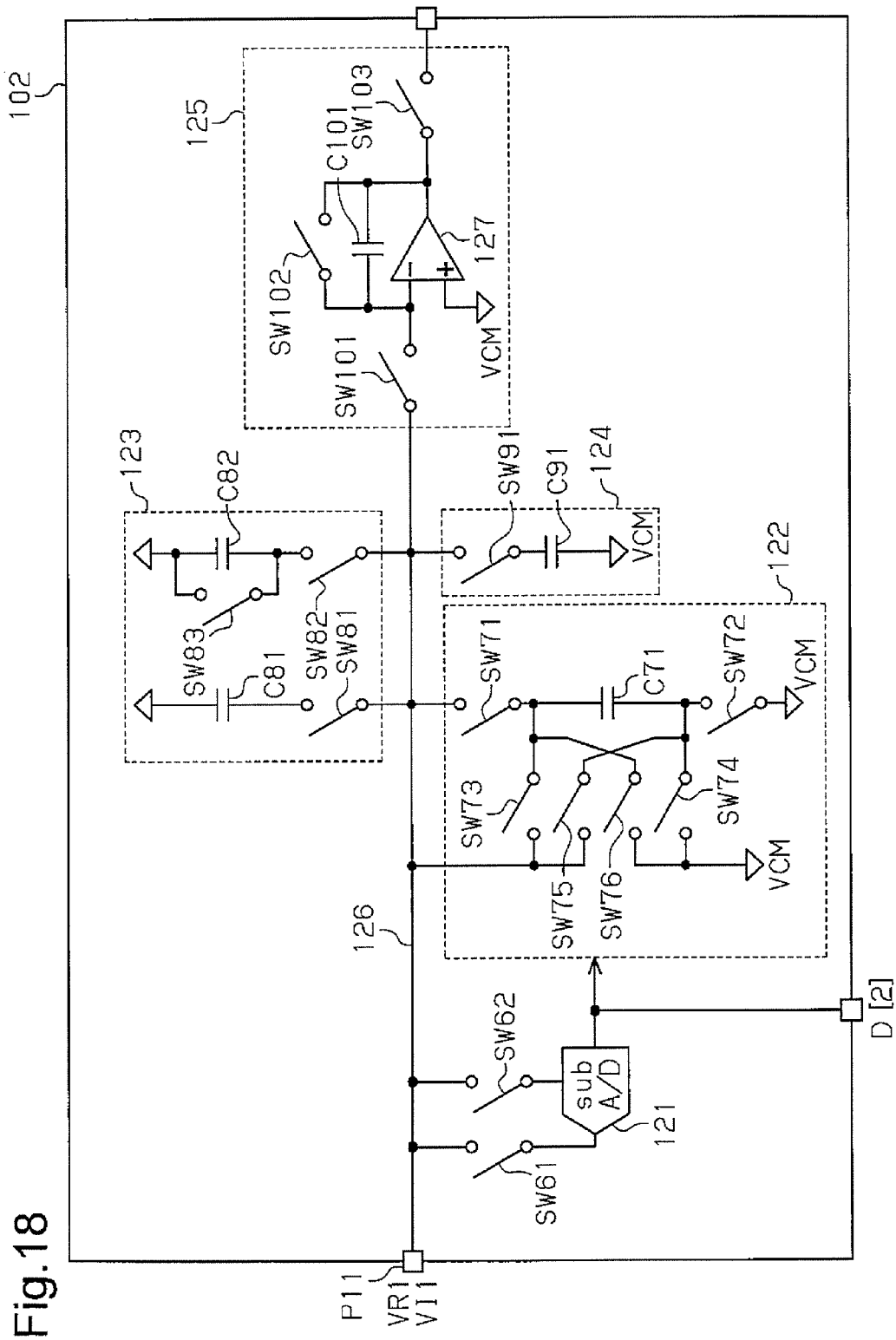
FIG. 18 is a circuit diagram of the conversion stage.

Next, a conversion stage 102 of the second level will be described. The same reference numeral is assigned to the same member as that of the conversion stage 101 of the first level, and description thereof will not be presented. As illustrated in FIG. 18, in the conversion stage 102, the supply path 126 is coupled to one external input terminal P11.

In other words, in the conversion stage 102 of the second level, switches SWa and SWb used for selectively supplying the reference signal voltage VREF or the input signal voltage VIN to the supply path 126 are omitted in the conversion stage 101 of the first level.

Figure 19A:
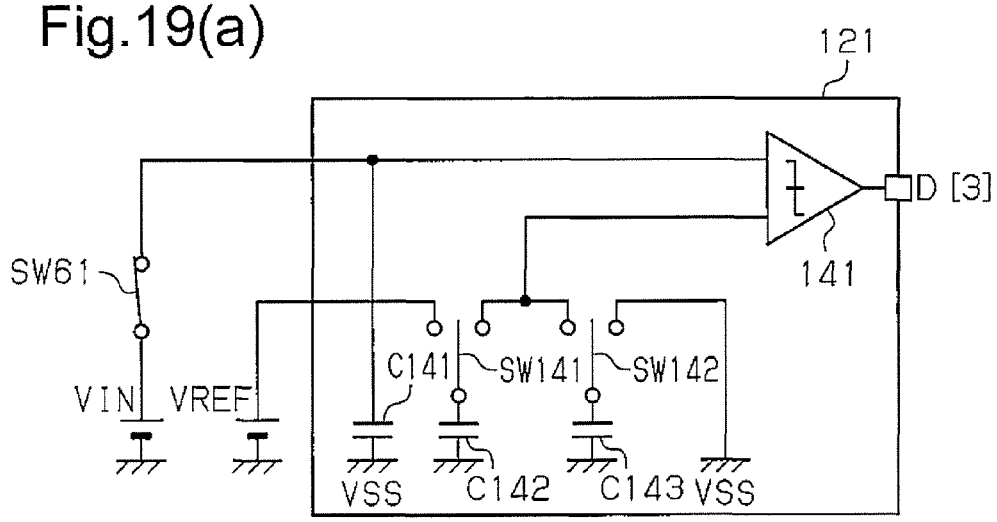
FIGS. 19(a) to 19(c) are schematic diagrams that illustrate the operation of a sub A/D converter.

The conversion stage 103 of the third level is similar to the conversion stage 102 of the second level, and thus, description thereof will not be presented. As illustrated in FIG. 19(a), the sub A/D converter 121 includes: a comparator 141; capacitors C141 to C143; and switches SW141 and SW142. A non-inverted input terminal of the comparator 141 is coupled to a first terminal of the capacitor C141, and a second terminal of the capacitor C141 is coupled to the wiring VSS. In addition, the first terminal of the capacitor C141 is supplied with the input signal voltage VIN through the switch SW61.

An inverted input terminal of the comparator 141 is coupled to the switches SW 141 and SW142. The switches SW141 and SW142 are changeover switches. A common terminal of the switch SW141 is coupled to a first terminal of the capacitor C142, and a second terminal of the capacitor C142 is coupled to the wiring VSS. The first terminal of the switch SW141 is supplied with the reference signal voltage VREF, and the second terminal of the switch SW141 is coupled to the second terminal of the switch SW142. A node disposed between both the second terminals of the switches SW141 and SW142 is coupled to the inverted input terminal of the comparator 141. A common terminal of the switch SW142 is coupled to a first terminal of the capacitor C143, and a second terminal of the capacitor C143 is coupled to the wiring VSS. A first terminal of the switch SW142 is coupled to the wiring VSS. The capacitance values of the capacitors C141 to C143 are set to be the same.

Figure 19B:
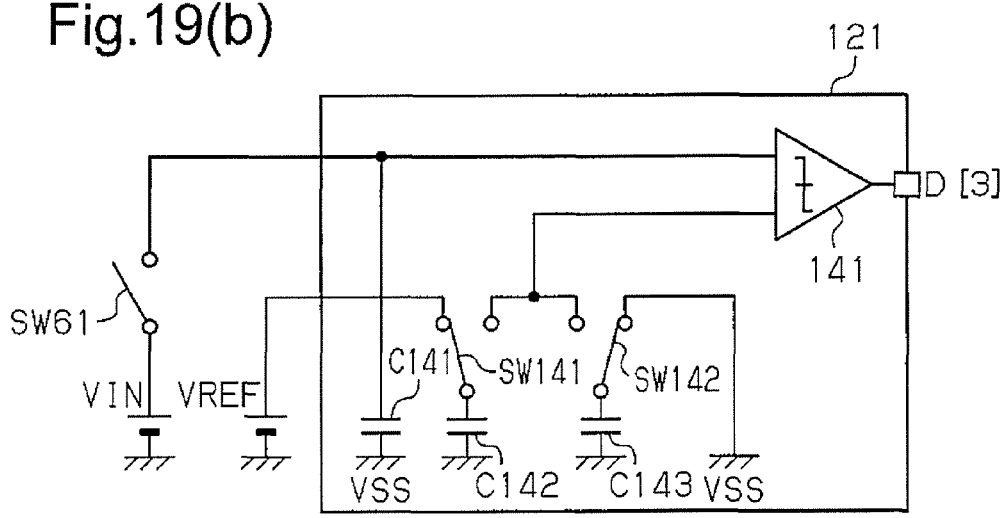

In the sub A/D converter 121, the switch SW61 is turned on, and electric charge according to the input signal voltage VIN is accumulated in the capacitor C141 (sample signal state). Next, as illustrated in FIG. 19(b), the switch SW61 is turned off. The common terminals of the switches SW141 and SW142 are respectively coupled to the first terminals thereof. The capacitor C142 accumulates electric charge according to the reference signal voltage VREF that is supplied through the switch SW141 (sample reference state). Both the terminals of the capacitor C143 are coupled to the wiring VSS through the switch SW142, and accordingly, the electric charge is discharged.

Figure 19C:
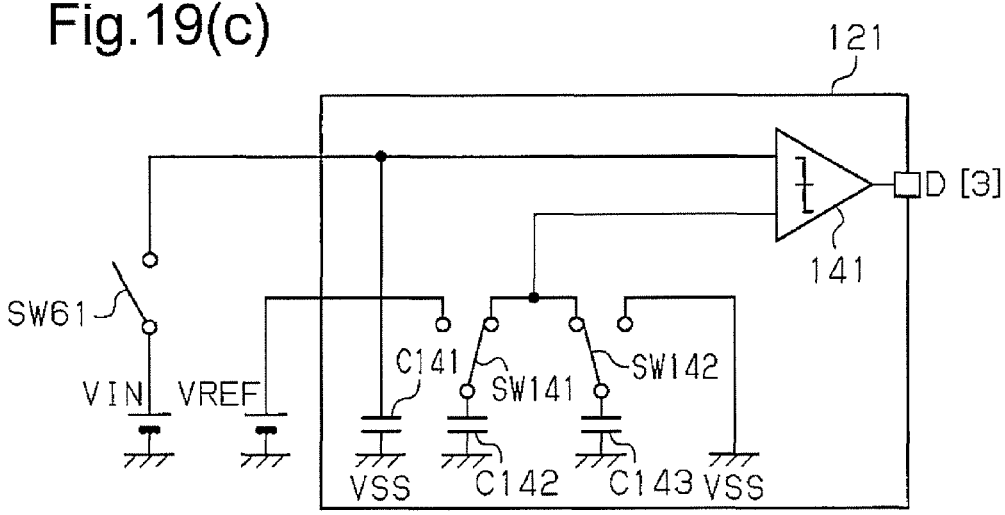

Next, as illustrated in FIG. 19(c), when the common terminals of the switches SW141 and SW142 are respectively coupled to the second terminals thereof, the electric charge accumulated in the capacitor C142 moves to the capacitor C143 through the switches SW141 and SW142. Accordingly, the amount of electric charge accumulated in the capacitor C142 changes in accordance with the capacitance ratio of the capacitors C142 and C143. Since the capacitance values of both the capacitors C142 and C143 are the same, the electric charge accumulated in the capacitor C142 is a half of the electric charge according to the reference signal voltage VREF. The comparator 141 outputs a digital signal D[3] having a value according to a result of the comparison between a voltage (=VIN) according to the electric charge accumulated in the capacitor C141 and a voltage (=VREF/2) according to the electric charge accumulated in the capacitor C142 (C143) (comparison state).

Next, the operation of the sub D/A converter 122 will be described. Here, a case will be described in which a voltage according to a signal voltage Vs is generated based on a reference voltage Vr.

Figure 20A:
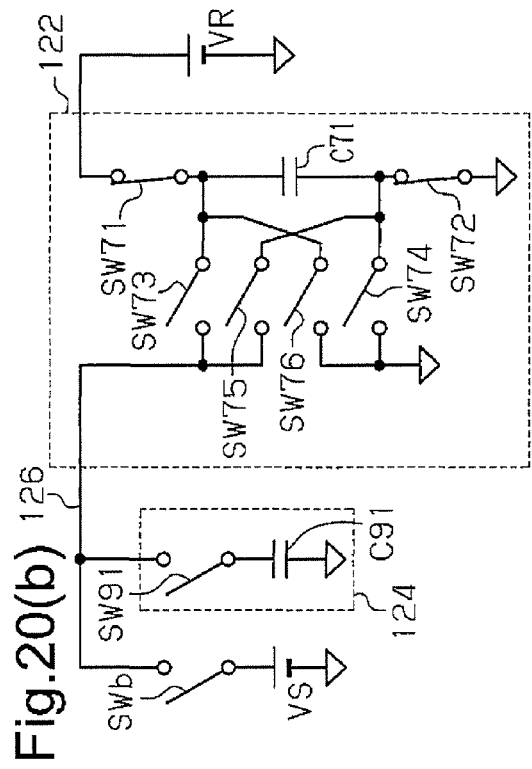
FIGS. 20(a) to 20(d) are schematic diagrams that illustrate the operation of a sub D/A converter.

First, as illustrated in FIG. 20(a), the switches SWb and SW91 are turned on, and electric charge according to the signal voltage Vs is accumulated in the capacitor C91 of the signal holding circuit 124 (sample signal state).

Figure 20C:
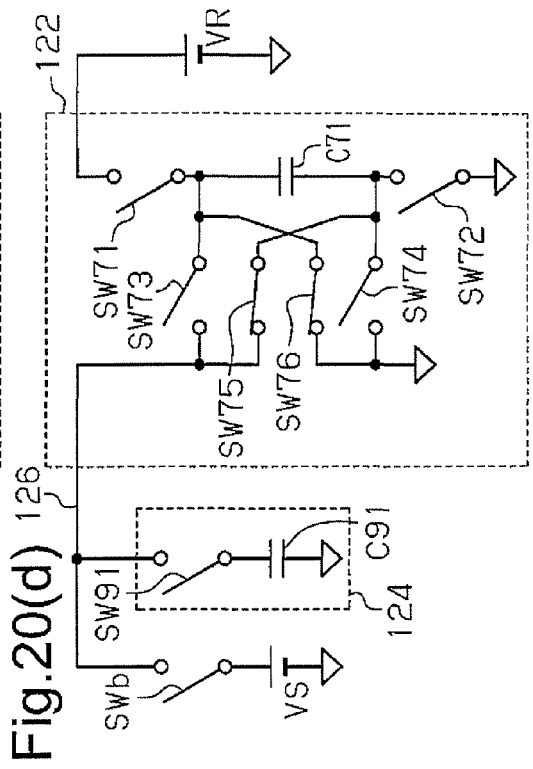
Figure 20B:
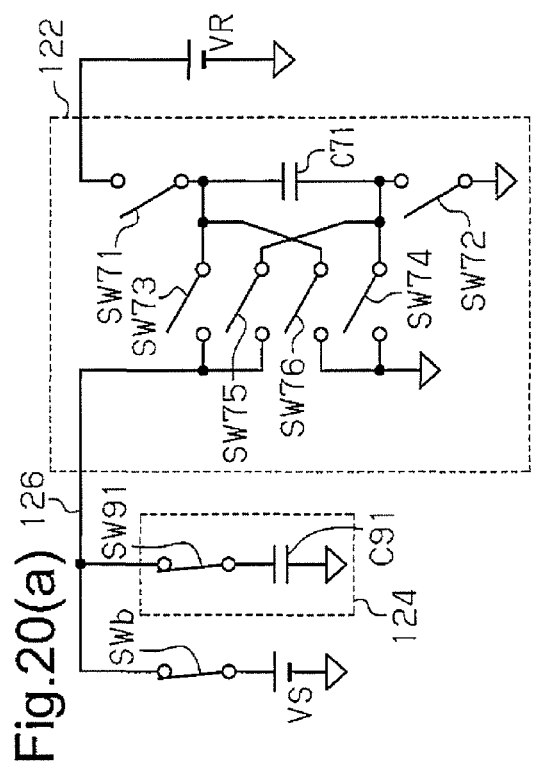

Next, as illustrated in FIG. 20(b), the switches SW71 and SW72 are turned on, and electric charge according to the reference voltage Vr is accumulated in the capacitor C71 of the sub D/A converter 122 (sample reference state).

Thereafter, as illustrated in FIG. 20(c), when the switches SW73 and SW74 are turned on, the voltage V(126) of the supply path 126 is V(126)=C(Vs+Vr)/2C=(Vs+Vr)/2 based on the electric charges accumulated in the capacitors C91 and C71. Here, "C" is the capacitance value of the capacitors C91 and C71.

Figure 20D:
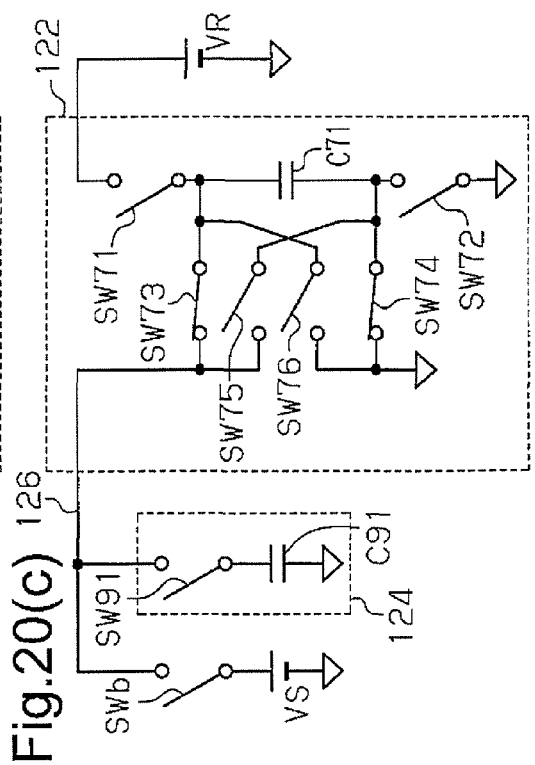

On the other hand, as illustrated in FIG. 20(d), when the switches SW75 and SW76 are turned on, the voltage V(126) of the supply path 126 is V(126)=C(Vs−Vr)/2C=(Vs−Vr)/2 based on the electric charges accumulated in the capacitors C91 and C71.

FIG. 21 illustrates the operations of the switches and the component (the sub A/D converter 121) illustrated in FIGS. 17 and 18 for each state. The switches SW73 to SW76 of the sub D/A converter 122 are turned on or off in response to a digital signal that is output from the sub A/D converter 121. The other switches are turned on or off in response to a control signal that is generated by the control signal generating circuit 112 illustrated in FIG. 13.

For example, the switch SW61 is turned on at the time of being in the sample signal state. The sub A/D converter 121 holds a voltage (the input signal voltage VIN) supplied through the switch SW61. In addition, the switch SW62 is turned on at the time of being in the sample reference state. The sub A/D converter 121 holds a voltage (the reference signal voltage VREF) that is supplied through the switch SW62. The sub A/D converter 121, at the time of being in the comparison state, outputs a digital signal D[n] (here, n is a number that representing each conversion stage) according to the held voltage (VIN or VREF).

In addition, the switch SW102 of the amplifier 125 may be turned on in a state other than the hold signal state in which an input signal voltage acquired by amplifying the residual voltage is output and the hold reference state in which the reference signal voltage is output. In FIG. 21, the switch SW102 is illustrated to be turned on in the sample signal state and the sample reference state. For example, each conversion stage, similar to the first embodiment, is controlled so as to simultaneously have the hold reference state and the comparison state. Accordingly, the switches SW101 and SW103 of the amplifier 125 are turned on or off in a manner similar to that of the case of the hold signal state or the hold reference state. In a case where control of the conversion stage is performed such that transitions of five conversion states are made in one A/D conversion cycle, in the comparison state, it may be configured such that the switch SW102 is turned on, and the switches SW102 and SW103 are turned off.

Next, the operation of the conversion stage for each conversion state will be described with reference to FIGS. 22(a), 22(b), 23(a), and 23(b). The operation of a part common to the conversion stage 101 of the first level illustrated in FIG. 17 and the conversion stage 102 of the second level (similar to the case of the conversion stage 103 of the third level) illustrated in FIG. 18 will be described. In other words, the operation will be described using the conversion stage 102 illustrated in FIG. 18. Reference numerals of members that are necessary for the description are assigned in FIGS. 22(a), 22(b), 23(a), and 23(b). It is assumed that the hold reference state is formed simultaneously with the comparison state.

Figure 22A:
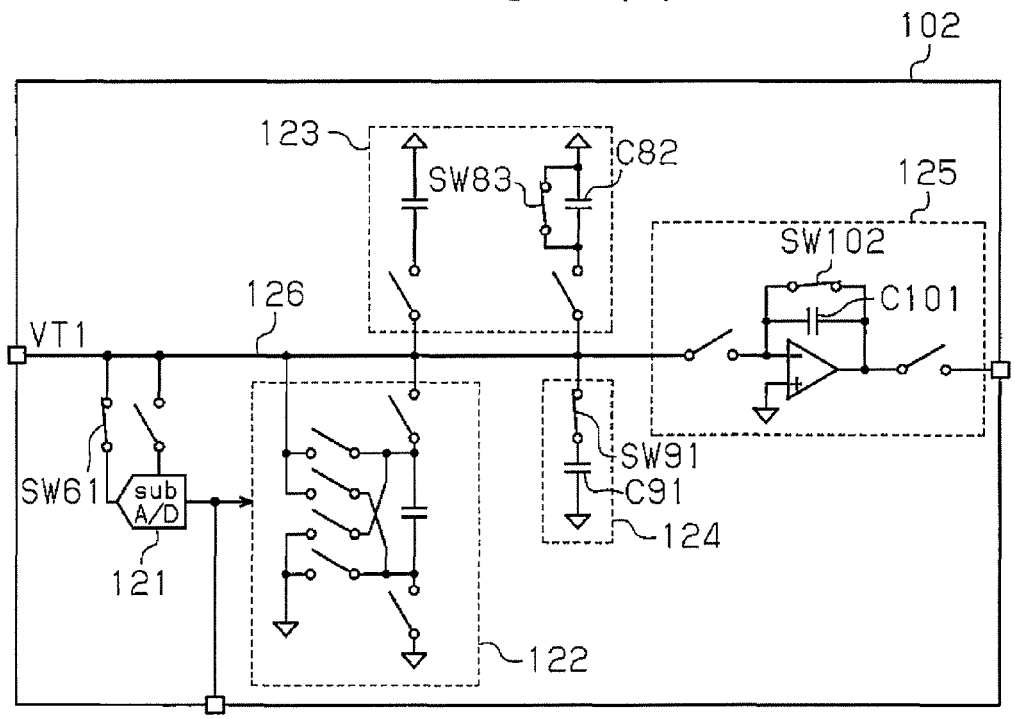
FIGS. 22(a) and 22(b) are schematic diagrams that illustrate the operation of the conversion stage.

FIG. 22(a) illustrates the sample signal state. In this state, the switch SW61 is turned on. The sub A/D converter 121 holds an input signal voltage VI1 that is supplied through the switch SW61. In addition, the switch SW91 is turned on, and electric charge according to the input signal voltage VI1 is accumulated in the capacitor C91 of the signal holding circuit 124. The switch SW102 of the amplifier 125 is turned on, and the capacitor C101 is reset. In addition, the switch SW83 of the reference holding circuit 123 is turned on, and the capacitor C82 is reset.

Figure 22B:
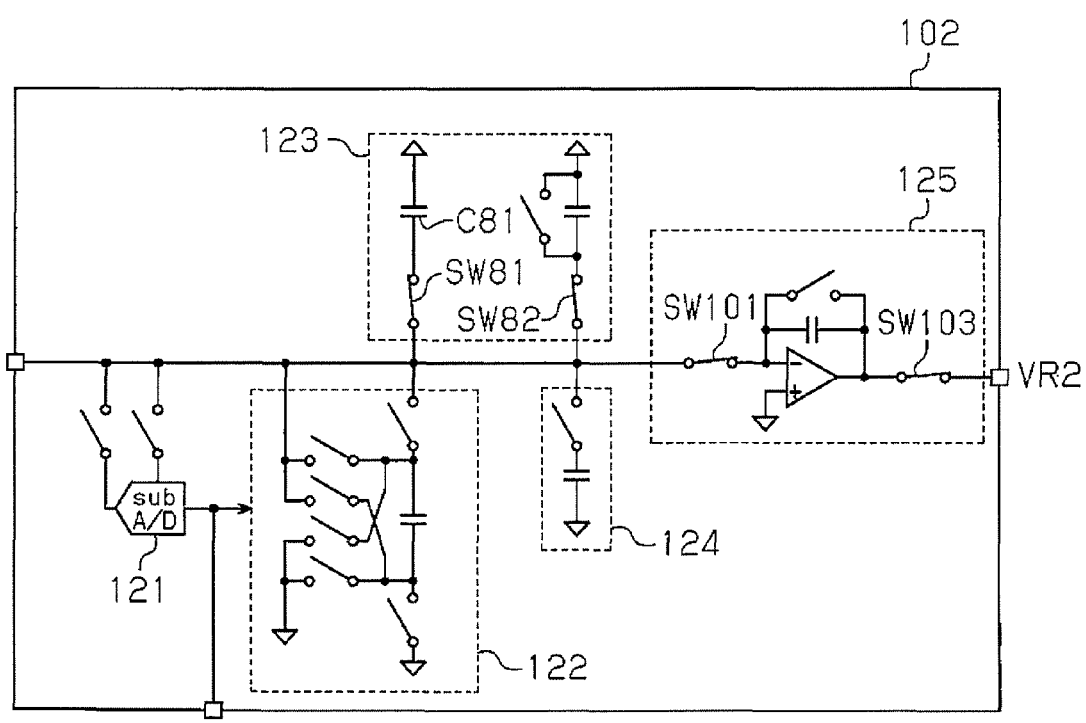

FIG. 22(b) illustrates the hold reference state and the comparison state. In this state, the switch SW81 of the reference holding circuit 123 is turned on, and the electric charge accumulated in the capacitor C81 moves to the capacitor C82. The switches SW101 and SW103 of the amplifier 125 are turned on, and a reference signal voltage VR2 according to the electric charges accumulated in the capacitors C81 and C82 is output.

Figure 23A:
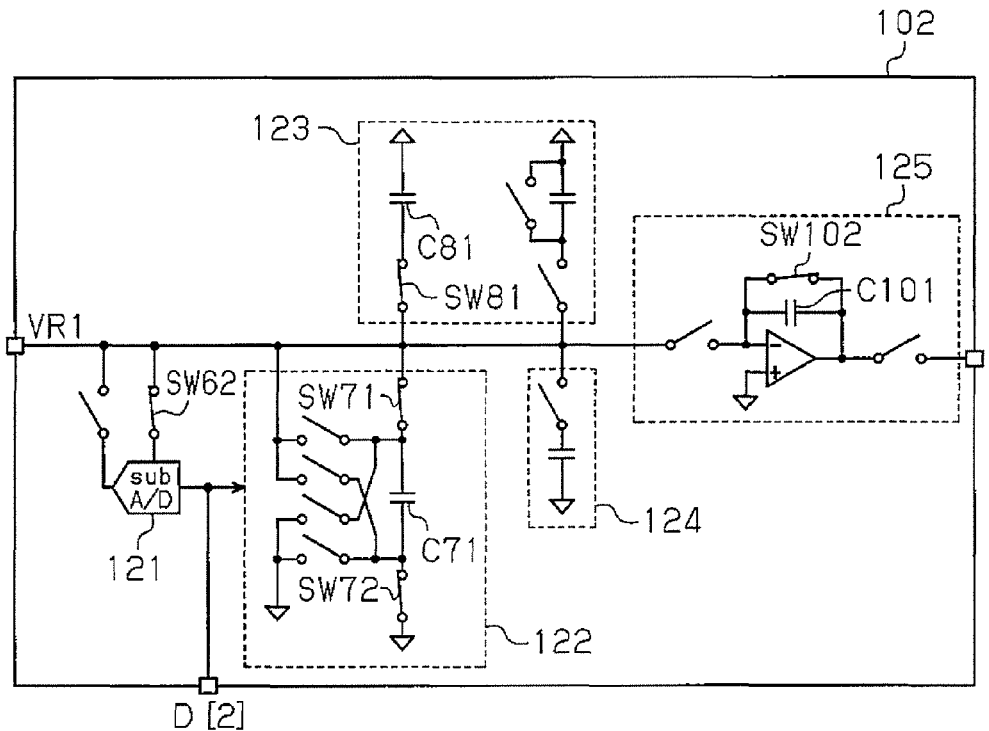
FIGS. 23(a) and 23(b) are schematic diagrams that illustrate the operation of the conversion stage.

FIG. 23(a) illustrates the sample reference state. In this state, the switch SW81 of the reference holding circuit 123 is turned on, and electric charge according to the reference signal voltage VREF is accumulated in the capacitor C81. In addition, the switch SW62 is turned on, and the sub A/D converter 121 holds the reference signal voltage VREF that is supplied through the switch SW62. The switches SW71 and SW72 of the sub D/A converter 122 are turned on, and electric charge according to the reference signal voltage VREF is accumulated in the capacitor C71.

Figure 23B:
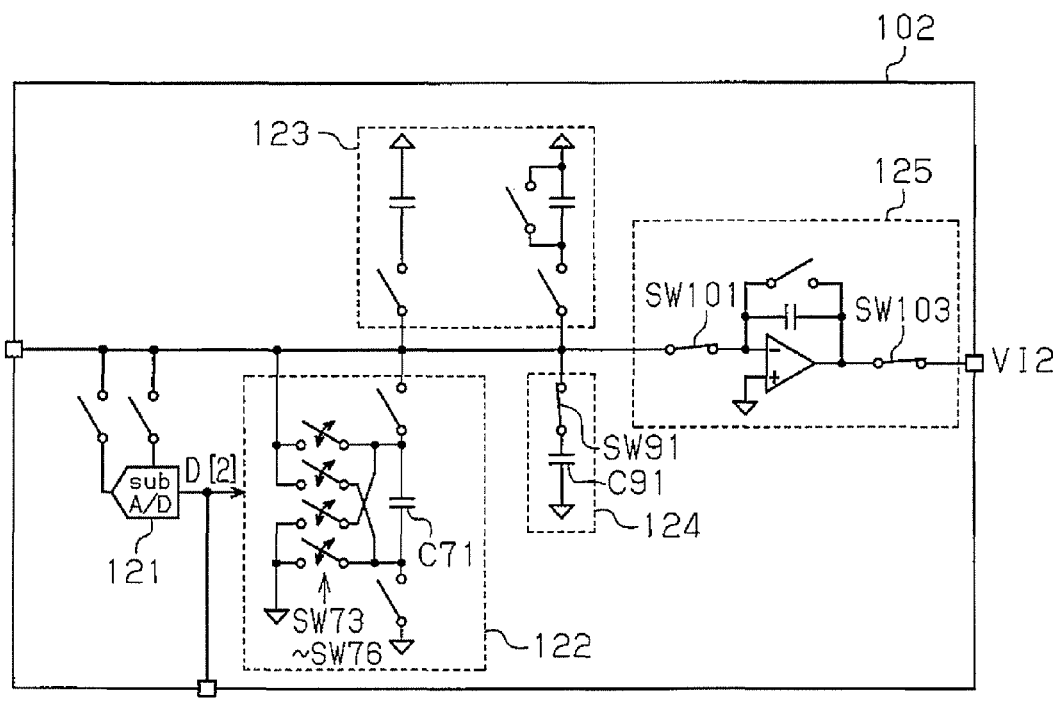

FIG. 23(b) illustrates the hold signal state. In this state, the switch SW91 of the signal holding circuit 124 is turned on. In addition, the switches SW73 to SW76 of the sub D/A converter 122 are turned on or off in accordance with the digital signal D[2]. Furthermore, the switches SW101 and SW103 of the amplifier 125 are turned on. Accordingly, the input signal voltage VI2 is output from the amplifier 125 in accordance with the electric charges accumulated in the capacitors C71 and C91 and the digital signal D[2].

Figure 24:
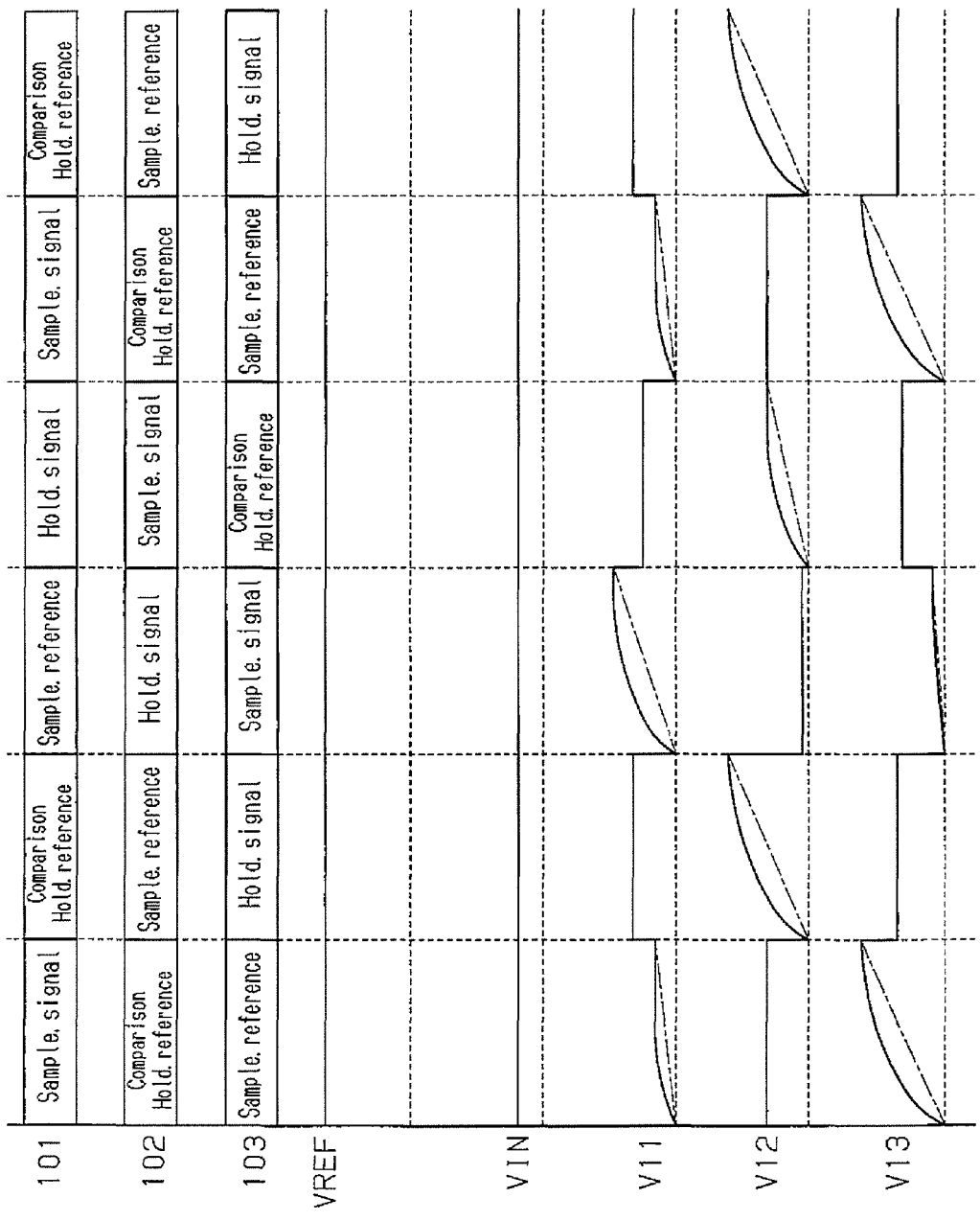
FIG. 24 is a schematic diagram that illustrates a state transition of the conversion stage and the electric potential of a supply path.

FIG. 24 illustrates an example of the state transitions made in each of the conversion stages 101 to 104 and changes in the electric potential of the supply path 126 in each of the conversion stages 101 to 104. In FIG. 24, a voltage VI1 represents a voltage of the supply path 126 of the conversion stage 101 of the first level, a voltage VI2 represents a voltage of the supply path 126 of the conversion stage 102 of the second level, and a voltage VI3 represents a voltage of the supply path 126 of the conversion stage 103 of the third level.

Figure 25A:
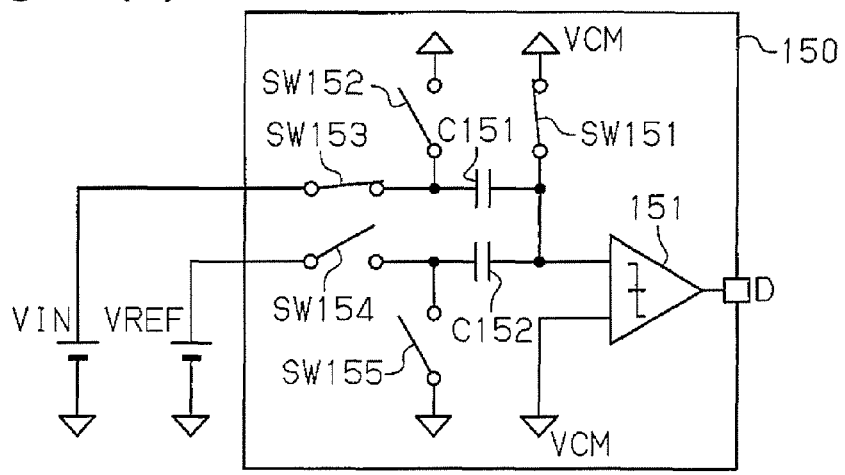
FIGS. 25(a) to 25(c) are schematic diagrams that illustrates another sub A/D converter.
Figure 25B:
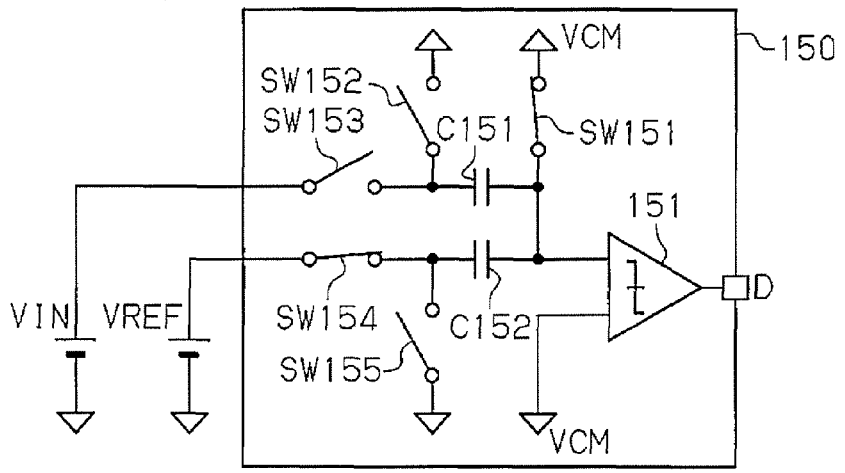
Figure 25C:
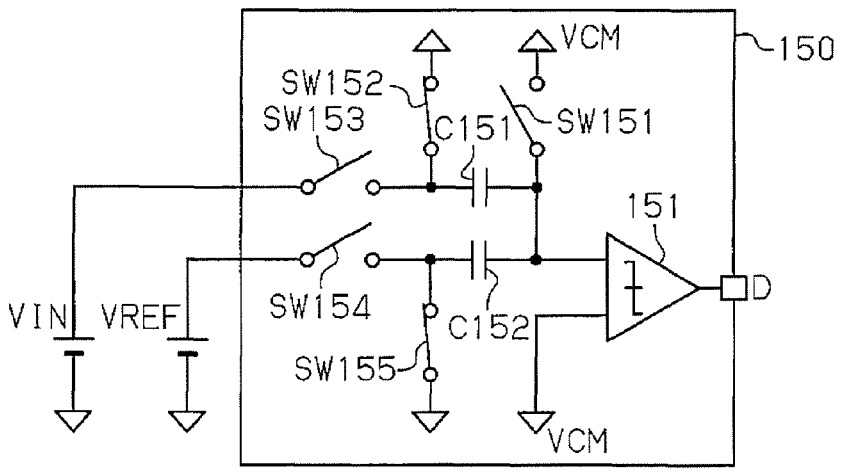

The sub A/D converter 150 illustrated in FIG. 25(a) may be used in the conversion stages 101 to 104 described above. The sub A/D converter 150 includes: a comparator 151; capacitors C151 and C152; and switches SW151 to SW155.

An inverted input terminal of the comparator 151 is coupled to the first terminals of the capacitors C151 and C152 and the first terminal of the switch SW151, and a second terminal of the switch SW151 is supplied with the common voltage VCM. A second terminal of the capacitor C151 is coupled to the first terminals of the switches SW152 and SW153. A second terminal of the switch SW152 is supplied with the common voltage VCM. A second terminal of the switch SW153 is supplied with an input signal voltage VIN. The second terminal of the capacitor C152 is coupled to first terminals of the switches SW154 and SW155. A second terminal of the switch SW154 is supplied with a reference signal voltage VREF. A second terminal of the switch SW155 is supplied with the common voltage VCM. A non-inverted input terminal of the comparator 151 is supplied with the common voltage VCM.

FIG. 25(a) illustrates the sample signal state. In this state, the switches SW151 and SW153 are turned on, and electric charge according to the input signal voltage VIN is accumulated in the capacitor C151. In the sample reference state illustrated in FIG. 25(b), the switches SW151 and SW154 are turned on, and electric charge according to the reference signal voltage VREF is accumulated in the capacitor C152. In the comparison state illustrated in FIG. 25(c), the switches SW152 and SW155 are turned on, and a digital signal D of one bit is output from the comparator 151 based on the electric charge accumulated in the capacitors C151 and C152 in accordance with the input signal voltage VIN and the reference signal voltage VREF.

According to the second embodiment, the following advantages are obtained.

(2-1) The sub A/D converter 121 of the conversion stage 101 converts the input signal voltage VIN into the digital signal D[3] based on the reference signal voltage VREF. The signal holding circuit 124 holds the input signal voltage VIN. The sub D/A converter 122 generates a first voltage that is based on the digital signal D[3] and the reference signal voltage VREF. The amplifier 125 generates an input signal voltage VI1 to be input to the conversion stage of the next level by amplifying a voltage according to the input signal voltage VIN held by the signal holding circuit 124 and the first voltage Vda supplied from the sub D/A converter 122. The reference holding circuit 123 holds a voltage according to the reference signal voltage VREF. The amplifier 125 generates a reference signal voltage VR1 to be input to the conversion stage of the next level by amplifying the voltage held by the reference holding circuit 123. The conversion stage 102 of the second level converts the input signal voltage VI1 into a digital signal D[2] based on the reference signal voltage VR1. Accordingly, advantages similar to the advantages (1-1) and (1-2) of the first embodiment may be obtained.

(2-2) As illustrated in FIG. 22(a), the signal holding circuit 124 accumulates electric charges according to the input signal voltage VI1 in the capacitor C91. As illustrated in FIG. 23(a), the sub D/A converter 122 accumulates electric charge according to the reference signal voltage VR1 in the capacitor C71. As illustrated in FIG. 23(b), the switches SW73 to SW76 of the sub D/A converter 122 are turned on or off based on the digital signal D[2] supplied from the sub A/D converter 121. An input signal voltage VI2 for the conversion stage of the next downstream level is generated based on the electric charge accumulated in the capacitor C71 and the electric charge accumulated in the capacitor C91 of the signal holding circuit 124. In this way, the conversion stage generates the input signal voltage VI2 based on the residual voltage generated by using the capacitors C71 and C91. The relative precision of a capacitor is higher than that of a resistor. Accordingly, by using the capacitors C71 and C91, a precise residual voltage may be generated. Accordingly, an error in the digital signal may be decreased to be less than that of a case where a sub D/A converter using resistors. Therefore, an A/D converter circuit performing an analog-to-digital conversion having excellent linearity may be obtained.

Third Embodiment

Figure 26:
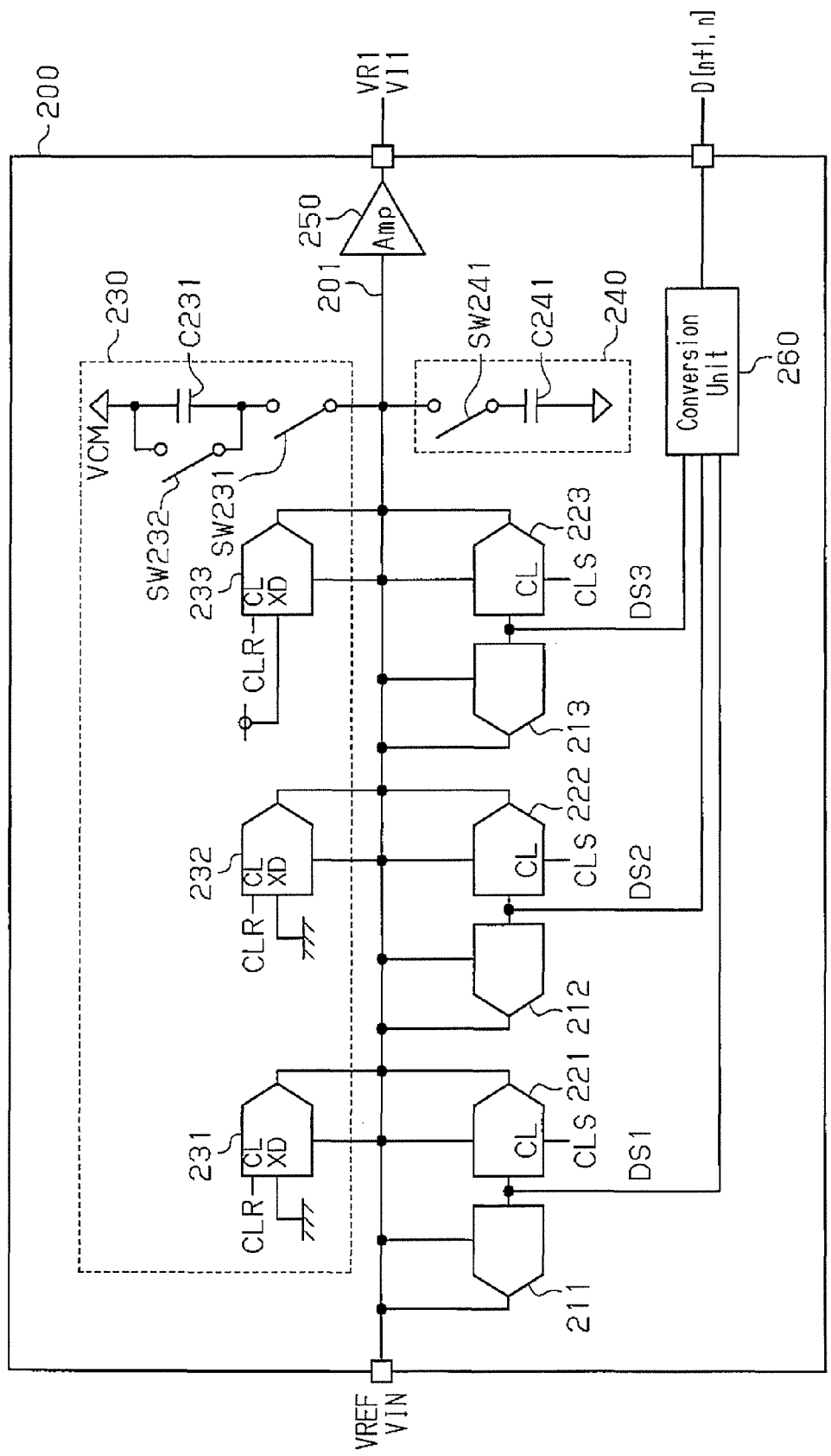
FIG. 26 is a circuit diagram of a conversion stage according to a third embodiment.

FIG. 26 illustrates an example of a conversion stage that generates a digital signal D[n+1, n] of two bits. This conversion stage 200 includes: three sub A/D converters 211 to 213; three sub D/A converters 221 to 223; a reference holding circuit 230; a signal holding circuit 240; an amplifier 250; and a conversion unit 260.

The sub A/D converters 211 to 213 set mutually-different threshold voltages based on the reference signal voltage VREF and output digital signals DS1 to DS3 according to results of the comparison between each threshold voltage and the input signal voltage VIN. The digital signals DS1 to DS3 are thermometer codes.

Each of the sub A/D converters 211 to 213, for example, is the same as the sub A/D converter 150 illustrated in FIG. 25(a). The setting of the threshold voltages, for example, are set based on the capacitance values of capacitors C151 and C152 illustrated in FIG. 25(a). By using the three sub A/D converters 121, thermometer codes of three bits are generated. The conversion unit 260 converts the thermometer codes DS1 to DS3 of three bits into a digital signal D[n+1, n] of two bits.

Figure 27:
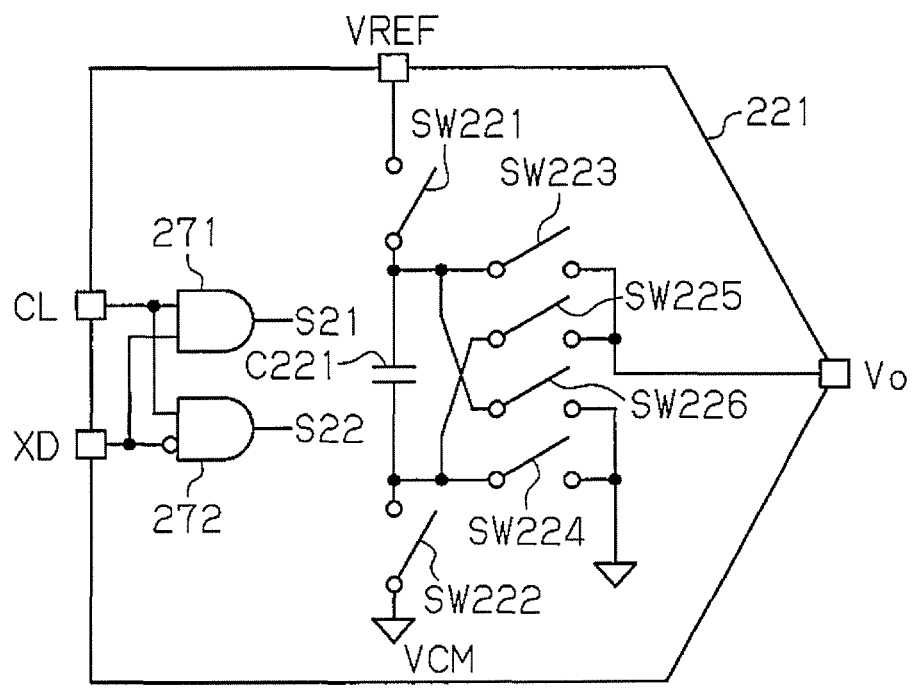
FIG. 27 is a circuit diagram of a sub D/A converter.

As illustrated in FIG. 27, the sub D/A converter 221 includes: logic circuits 271 and 272; a capacitor C221; and switches SW221 to SW226. The logic circuit 271 generates a signal S21 by performing an AND operation of a signal input through a control terminal CL and a signal input through a data terminal XD.

The logic circuit 272 logically inverts the signal input through the data terminal XD and generates a signal S22 by performing an AND operation of the signal after the inversion and the signal input through the control terminal CL. A first terminal of the capacitor C221 is coupled to a first terminal of the switch SW221, and a second terminal of the switch SW221 is supplied with the reference signal voltage VREF. A second terminal of the capacitor C221 is coupled to a first terminal of the switch SW222, and a second terminal of the switch SW222 is supplied with the common voltage VCM.

In addition, the first terminal of the capacitor C221 is coupled to first terminals of the switches SW223 and SW226, and the second terminal of the capacitor C221 is coupled to first terminals of the switches SW224 and SW225. Second terminals of the switches SW223 and SW225 are coupled to an output terminal, and second terminals of the switches SW224 and SW226 are supplied with the common voltage VCM. The switches SW223 and SW224 are turned on or off in accordance with the signal S21. In addition, the switches SW225 and SW226 are turned on or off in accordance with the signal S22.

Each of the sub D/A converters 222 and 223 illustrated in FIG. 26 is the same as the sub D/A converter 221. A control signal CLS is supplied to the control terminal CL of each of the sub D/A converters 221 to 223. This control signal CLS is generated to be at the H level at the time of being in the hold signal state (the L level at the time of being in the other states) by a control circuit (not illustrated in the figure) corresponding to the conversion stage 200.

The reference holding circuit 230 includes: three sub D/A converters 231 to 233, a capacitor C231, and switches SW231 and SW232. Each of the sub D/A converters 231 and 233 is the same as the sub D/A converter 221 illustrated in FIG. 27. A control signal CLR is supplied to a control terminal CL of each of the sub D/A converters 231 to 233. This control signal CLR is generated to be at the H level at the time of being in the hold reference state (the L level at the time of being in the other states) by a control circuit (not illustrated in the figure) corresponding to the conversion stage 200.

The data terminals XD of the sub D/A converters 231 and 232 are coupled to the wiring VSS. A data terminal XD of the sub D/A converter 233 is coupled to a wiring to which a high electric potential voltage VDD is supplied.

A first terminal of the capacitor C231 is supplied with the common voltage VCM, a second terminal of the capacitor C231 is coupled to a first terminal of the switch SW231, and a second terminal of the switch SW231 is coupled to a supply path 201. The switch SW232 is coupled between both terminals of the capacitor C231. The capacitance of the capacitor C231 is set to four times of the capacitance value of the capacitor (the capacitor C221 illustrated in FIG. 26) included in each of the three sub D/A converters 221 to 223.

This reference holding circuit 230 generates a reference signal voltage corresponding to 1 LSB in the hold reference state. The signal holding circuit 240 includes a capacitor C241 and a switch SW241. A first terminal of the capacitor C241 is coupled to the supply path 201 through the switch SW241, and a second terminal of the capacitor C241 is supplied with the common voltage VCM. The capacitance value of the capacitor C241 is set to four times of the capacitance value of the capacitor C221 illustrated in FIG. 27.

The amplifier 250 outputs a voltage acquired by amplifying the electric potential of the supply path 201. The amplification factor of the amplifier 250 is set to four. According to the third embodiment, the following advantages may be obtained.

(3-1) The A/D converter circuit using the conversion stage 200 that generates a digital signal D[n+1, n] of two bits, similar to the above-described embodiment, has an excellent monotonously increasing characteristic.

Fourth Embodiment

Figure 28:
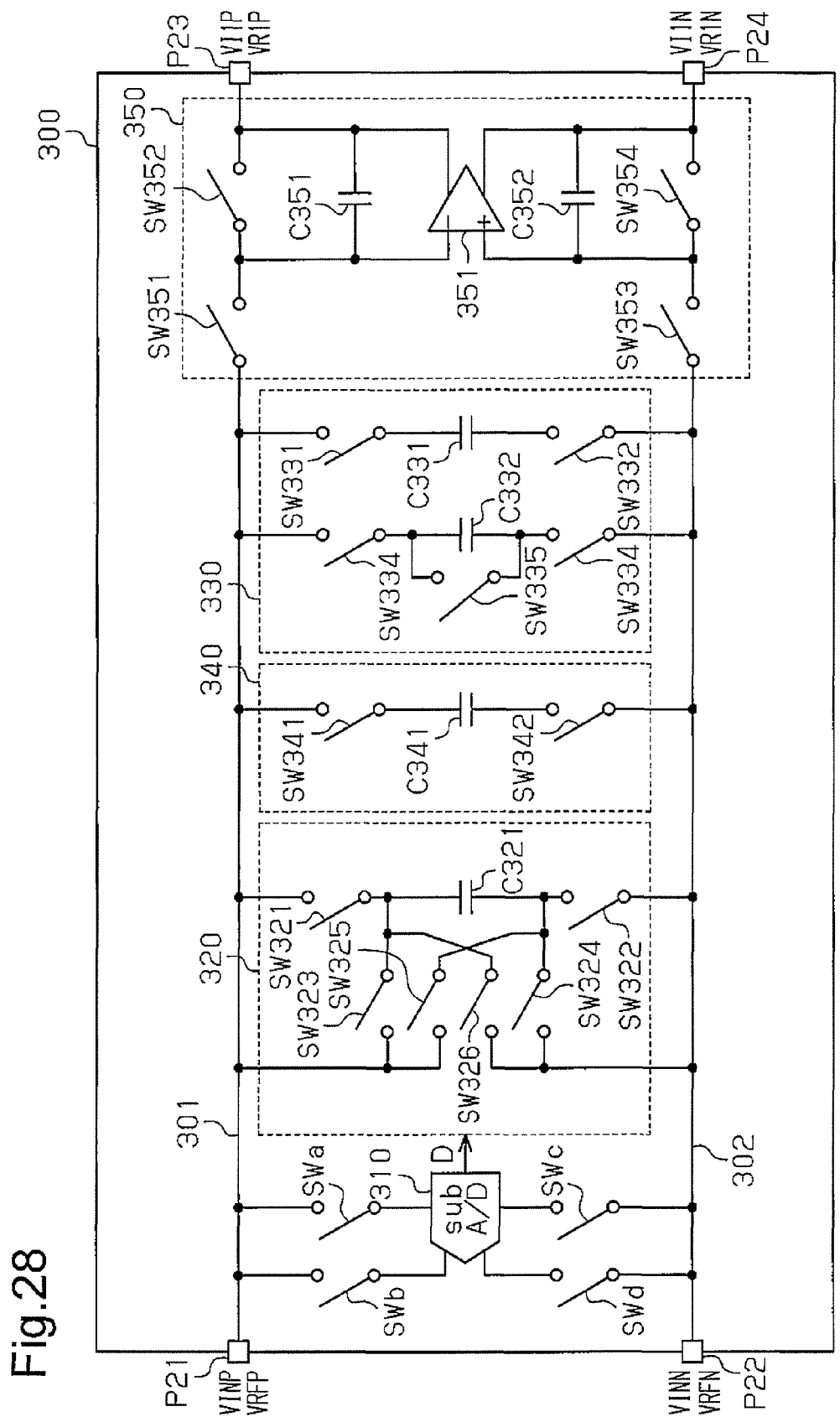
FIG. 28 is a circuit diagram of a conversion stage according to a fourth embodiment.

As illustrated in FIG. 28, a conversion stage 300 generates a digital signal D[3] by performing a digital conversion of input signal voltages VINP and VINN based on reference signal voltages VRFP and VRFN and the input signal voltages VINP and VINN. In addition, the conversion stage 300, based on the digital signal D[3], generates input signal voltages VI1P and VI1N according to the reference signal voltages VRFP and VRFN and the input signal voltages VINP and VINN. Furthermore, the conversion stage 300 generates reference signal voltages VR1P and VR1N for the conversion stage of the next level based on the reference signal voltages VRFP and VRFN.

The conversion stage 300 includes: a sub A/D converter 310; a sub D/A converter (denoted by "C-D/A" in the FIG. 320; a reference holding circuit 330; a signal holding circuit 340; an amplifier 350; and switches SWa to SWd.

External input terminals P21 and P22 of the conversion stage 300 are supplied with the reference signal voltages VRFP and VRFN and the input signal voltages VINP and VINN at mutually different timings. The external input terminals P21 and P22 of the conversion stage 300 are coupled to supply paths 301 and 302. The sub A/D converter 310 is supplied with the reference signal voltages VRFP and VRFN of the supply paths 301 and 302 through the switches SWa and SWc. In addition, the sub A/D converter 310 is supplied with the input signal voltages VINP and VINN of the supply paths 301 and 302 through the switches SWb and SWd.

The sub A/D converter 310 holds the reference signal voltages VRFP and VRFN and the input signal voltages VINP and VINN. The sub A/D converter 310 generates a digital signal D[3] acquired by performing a digital conversion of the input signal voltages VINP and VINN based on the held voltages.

Figure 29:
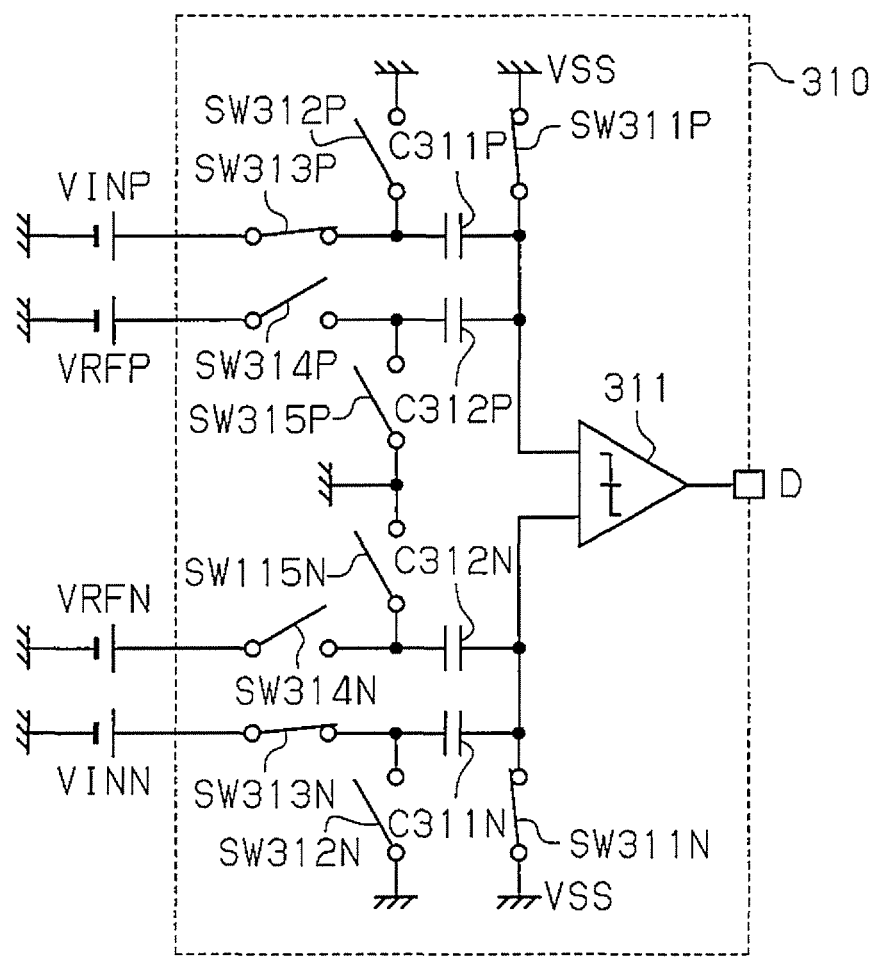
FIG. 29 is a circuit diagram of a sub A/D converter.

As illustrated in FIG. 29, the sub A/D converter 310 includes: a comparator 311; capacitors C311P, C312P, C311N, and C312N; and switches SW311P to SW315P and SW311N to SW315N.

An inverted input terminal of the comparator 311 is coupled to first terminals of the capacitors C311P and C312P and a first terminal of the switch SW311P, and a second terminal of the switch SW311P is coupled to the wiring VSS to which a low electric potential voltage VSS (for example, 0 [V]) is supplied. A second terminal of the capacitor C311P is coupled to first terminals of the switches SW312P and SW313P. A second terminal of the switch SW312P is coupled to the wiring VSS, and a second terminal of the switch SW313P is supplied with the input signal voltage VINP. The second terminal of the capacitor C312P is coupled to first terminals of the switches SW314P and SW315P. A second terminal of the switch SW314P is supplied with the reference signal voltage VRFP, and a second terminal of the switch SW315P is coupled to the wiring VSS. The second terminals of the switches SW313P and SW314P are coupled to the supply path 301 illustrated in FIG. 28.

A non-inverted input terminal of the comparator 311 is coupled to the first terminals of the capacitors C311N and C312N and the first terminal of the switch SW311N, and the second terminal of the switch SW311N is coupled to the wiring VSS to which a low electric potential voltage VSS (for example, 0 [V]) is supplied. The second terminal of the capacitor C311N is coupled to the first terminals of the switches SW312N and SW313N. The second terminal of the switch SW312N is coupled to the wiring VSS, and the second terminal of the switch SW313N is supplied with the input signal voltage VINN. The second terminal of the capacitor C312N is coupled to first terminals of the switches SW314N and SW315N. A second terminal of the switch SW314N is supplied with the reference signal voltage VRFN, and the second terminal of the switch SW315N is coupled to the wiring VSS. The second terminals of the switches SW313N and SW314N are coupled to the supply path 302 illustrated in FIG. 28.

In the sample signal state, the switches SW311P and SW313P are turned on, and electric charge according to the input signal voltage VINP is accumulated in the capacitor C311P. Similarly, the switches SW311N and SW313N are turned on, and electric charge according to the input signal voltage VINN is accumulated in the capacitor C311N. In the sample reference state, the switches SW311P and SW314P are turned on, and electric charge according to the reference signal voltage VRFP is accumulated in the capacitor C312P. Similarly, the switches SW311N and SW314N are turned on, and electric charge according to the reference signal voltage VRFN is accumulated in the capacitor C312N. In the comparison state, the switches SW312P, SW315P, SW312N, and SW315N are turned on, and a digital signal D[3] of one bit is output from the comparator 311 in accordance with the input voltages VINP and VINN and the reference signal voltages VRFP and VRFN.

As illustrated in FIG. 28, the sub D/A converter 122 includes: a capacitor C321; and switches SW321 to SW326. A first terminal of the capacitor C321 is coupled to the supply path 301 through the switch SW321, and a second terminal of the capacitor C321 is coupled to the supply path 302 through the switch SW322. In addition, the first terminal of the capacitor C321 is coupled to first terminals of the switches SW323 and SW326, and the second terminal of the capacitor C321 is coupled to first terminals of the switches SW324 and SW325. Second terminals of the switches SW323 and SW325 are coupled to the supply path 301, and second terminals of the switches SW324 and SW326 are coupled to the supply path 302.

The switches SW321 and SW322 are turned on in the sample reference state, and electric charge according to the reference signal voltages VRFP and VRFN are held by the capacitor C321. In the hold signal state, the switches SW323 to SW326 are turned on or off in accordance with the digital signal D and electrically couple both terminals of the capacitor C321 to the supply paths 301 and 302.

The reference holding circuit 330 includes: capacitors C331 and C332; and switches SW331 to SW335. A first terminal of the capacitor C331 is coupled to the supply path 301 through the switch SW331, and a second terminal of the capacitor C331 is coupled to the supply path 302 through the switch SW332. A first terminal of the capacitor C332 is coupled to the supply path 301 through the switch SW333, and a second terminal of the capacitor C332 is coupled to the supply path 302 through the switch SW334. The switch SW335 is coupled between both terminals of the capacitor C332.

In the sample reference state, first, the switches SW331 and SW332 are turned on, and electric charge according to the reference signal voltages VRFP and VRFN is accumulated in the capacitor C331. Thereafter, the switches SW333 and SW334 are turned on, and the electric charge accumulated in the capacitor C331 moves to the capacitor C332. Accordingly, in the capacitors C331 and C332, electric charges according to the capacitance values are accumulated. The capacitance values of the capacitors C331 and C332 are set in accordance with the amplification factor of the amplifier 350. For example, when the amplification factor of the amplifier 350 is "2", the capacitance values of the capacitors C331 and C332 are set to be the same (capacitance ratio=1:1), and electric charge according to a half of the reference signal voltages VRFP and VRFN is accumulated in the capacitor C331.

The signal holding circuit 340 includes a capacitor C341 and switches SW341 and SW342. A first terminal of the capacitor C341 is coupled to the supply path 301 through the switch SW341, and a second terminal of the capacitor C341 is coupled to the supply path 302 through the switch SW342. In the sample signal state, the switches SW341 and SW342 are turned on, and electric charge according to the input signal voltages VINP and VINN is accumulated in the capacitor C341. In addition, in the hold signal state, the switches SW341 and SW342 are turned on. Accordingly, the amounts of electric charges accumulated in the capacitor C321 of the sub D/A converter 320 and the capacitor C341 of the signal holding circuit 340 have values according to residual voltages between the input signal voltages VINP and VINN and the reference signal voltages VRFP and VRFN.

The amplifier 350 includes: a differential amplifier 351; capacitors C351 and C352; and switches SW351 to SW354. A first terminal of the switch SW351 is coupled to the supply path 301, and a second terminal of the switch SW351 is coupled to an inverted input terminal of the differential amplifier 351. The capacitor C351 and the switch SW352 are coupled between an inverted output terminal and the inverted input terminal of the differential amplifier 351. The inverted output terminal of the differential amplifier 351 is coupled to an external output terminal P23. A first terminal of the switch SW353 is coupled to the supply path 302, and a second terminal of the switch SW353 is coupled to a non-inverted input terminal of the differential amplifier 351. The capacitor C352 and the switch SW354 are coupled between a non-inverted output terminal and the non-inverted input terminal of the differential amplifier 351. The non-inverted output terminal of the differential amplifier 351 is coupled to an external output terminal P24.

In the hold signal state, the switches SW351 and SW353 are turned on, and the input signal voltages VI1P and VI1N are output from the differential amplifier 351. In the hold reference state, the switches SW351 and SW353 are turned on, and the reference signal voltages VR1P and VR1N are output from the differential amplifier 351. The switches SW352 and SW354 are turned on in the sample signal state or the sample reference state, and the electric potential of both terminals of each of the capacitors C351 and C352 is caused to be the same. In a case where the comparison state is formed at timing different from that of the hold reference state or the hold signal state, the switches SW352 and SW354 may be configured to be turned on in the comparison state.

According to the fourth embodiment, the following advantages are obtained.

(4-1) The A/D converter circuit using the conversion stage 300 that generates a digital signal D based on the input signal voltages VINP and VINN and the reference signal voltages VRFP and VRFN, similar to the above-described embodiment, has an excellent monotonously increasing characteristic.

The embodiment may be changed as below. In the second embodiment, the states may be configured to be formed at mutually-different timings. In such a case, the clock signal generating circuit generates a state control signal in accordance with a state to be formed.

In the third embodiment, while the conversion stage that generates a digital signal of two bits has been described, the conversion stage may be configured to generate digital signals of three or more bits. Similarly, the conversion stage according to the fourth embodiment may be configured to output a digital signal of two or more bits.

In addition, the A/D converter circuit may be configured to include a conversion stage that generates a digital signal having a different number of bits. For example, the A/D converter circuit may be configured to include a conversion stage that generates a digital signal of one bit and a conversion stage that generates a digital signal of two bits. Furthermore, the A/D converter circuit may be configured to include a conversion stage of a digital signal of one bit, a conversion stage of a digital signal of two bits, and a conversion stage of a digital signal of three or more bits.

The A/D converter circuit may be configured to include a sub A/D converter including the conversion stage according to the embodiment and a sub A/D converter (for example, a successive approximation-type sub A/D converter) of a different form. As in the second to fourth embodiments, in the case of the conversion stages 101 to 104, 200, and 300 using the electric charge sharing-type D/A converter (CDAC), a static reference signal voltage (VREF or the like) is not necessary. Accordingly, the amplifiers 125, 250, and 350 of each conversion stage may be configured as current and voltage amplifiers (for example, Gm amplifiers) that perform voltage/current amplification. In a case where the Gm amplifier is used, for example, the voltage VI1 of the supply path 126 in the conversion stage 101 illustrated in FIG. 17 changes as denoted by a dashed line in FIG. 24. Similarly, the voltages VI2 and VI3 of the supply path 126 in the conversion stage 102 of the second level and the conversion stage 103 of the third level change as denoted by a dashed line in FIG. 24. For example, since the power consumption of the Gm amplifier is lower than that of the operational amplifier, low power consumption may be achieved.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

What is claimed is:

1. An analog-to-digital converter circuit comprising:
   a plurality of conversion stages that are cascaded to be coupled in series, each of the plurality of conversion stages including
      a signal holding circuit configured to hold an input voltage;
      an analog-to-digital converter configured to convert the input voltage into a digital signal based on a first reference voltage;
      a digital-to-analog converter configured to generate a first voltage according to the digital signal, the first reference voltage, and the input voltage;
      an amplifier configured to amplify the first voltage to generate an output voltage; and
      a reference holding circuit configured to hold a holding voltage that is in proportion to the first reference voltage,
   the amplifier being coupled to the reference holding circuit to receive and amplify the holding voltage to generate a second reference voltage.

2. The analog-to-digital converter circuit according to claim 1, wherein
   the plurality of conversion stages include a first conversion stage and a second conversion stage that is coupled to a next level of the first conversion stage,
   the output voltage of the first conversion stage that is generated by the amplifier of the first conversion stage is supplied to the second conversion stage so as to be used as an input voltage for the second conversion stage, and
   the second reference voltage of the first conversion stage that is generated by the amplifier of the first conversion stage is supplied to the second conversion stage so as to be used as a first reference voltage for the second conversion stage.

3. The analog-to-digital converter circuit according to claim 1, further comprising a control circuit that controls the plurality of conversion stages, wherein the control circuit causes each of the conversion stages to make transitions among:
   a first state in which the input voltage is sampled;
   a second state in which the holding voltage according to the first reference voltage is held;
   a third state in which the amplifier is caused to generate the output voltage; and
   a fourth state in which the amplifier is caused to generate the second reference voltage.

4. The analog-to-digital converter circuit according to claim 3, wherein the control circuit performs control of the plurality of the conversion stages such that each of the conversion stages generates the digital signal according to the input voltage and the first reference voltage in the third or fourth state.

5. The analog-to-digital converter circuit according to claim 1, further comprising a control circuit that controls the plurality of conversion stages, wherein the control circuit causes each of the conversion stages to make transitions among:
   a first state in which the input voltage is sampled;
   a second state in which the holding voltage according to the first reference voltage is held;
   a third state in which the analog-to-digital converter is caused to generate the digital signal according to the input voltage and the first reference voltage;
   a fourth state in which the amplifier is caused to generate the output voltage; and
   a fifth state in which the amplifier is caused to generate the second reference voltage.

6. The analog-to-digital converter circuit according to claim 5, wherein the analog-to-digital converter holds the input voltage in the first state, holds the first reference voltage and generates a threshold voltage based on the held first reference voltage in the second state, and generates the digital signal by comparing the held input voltage with the threshold voltage.

7. The analog-to-digital converter circuit according to claim 5, wherein
   the digital-to-analog converter holds the first reference voltage in the second state, and
   the digital-to-analog converter generates the first voltage by performing addition of and/or subtraction between the input voltage held by the signal holding circuit and the first reference voltage held by the digital-to-analog converter in accordance with a configuration of the digital signal.

8. The analog-to-digital converter circuit according to claim 1, wherein the digital-to-analog converter is an electric charge sharing-type digital-to-analog converter.

9. The analog-to-digital converter circuit according to claim 1, wherein the amplifier is a switched capacitor amplifier that includes a capacitor and a switch.

10. The analog-to-digital converter circuit according to claim 1, wherein the amplifier is a current and voltage amplifier.

11. A method of controlling an analog-to-digital converter circuit including a plurality of conversion stages that are cascaded to be coupled in series, the method comprising:
controlling the plurality of conversion stages, the controlling of the plurality of conversion stages including causing each of the plurality of conversion stages to make transitions among:
a first state in which an input voltage is sampled;
a second state in which a holding voltage according to a first reference voltage is held;
a third state in which the input voltage is converted into a digital signal based on the first reference voltage;
a fourth state in which an output voltage is generated by causing an amplifier to amplify a first voltage according to the digital signal, the first reference voltage, and the input voltage; and
a fifth state in which a second reference voltage is generated by causing the amplifier to amplify the holding voltage.

12. The method according to claim 11, wherein the controlling of the plurality of conversion stages includes, when a conversion stage of a specific level among the plurality of conversion stages is caused to make a transition to the fifth state, causing a conversion stage of a next level of the conversion stage of the specific level to make a transition to the second state and, when a conversion stage of a specific level is caused to make a transition to the fourth state, causing a conversion stage of the next level of the conversion stage of the specific level to make a transition to the first state.

13. The method according to claim 11, wherein the controlling of the plurality of conversion stages includes causing each of the conversion stages to sequentially make transitions to the first state, the third state, and the second state, and each of the conversion stages has the fourth state simultaneously with the first state or the third state.

* * * * *